United States Patent
Park et al.

(10) Patent No.: US 10,435,587 B2
(45) Date of Patent: Oct. 8, 2019

(54) POLISHING COMPOSITIONS AND METHODS OF MANUFACTURING SEMICONDUCTOR DEVICES USING THE SAME

(71) Applicant: SAMSUNG ELECTRONICS CO., LTD., Suwon-si, Gyeonggi-do (KR)

(72) Inventors: Seung-Ho Park, Suwon-si (KR); Ki-Hwa Jung, Cheongju-si (KR); Sang-Kyun Kim, Hwaseong-si (KR); Jun-Ha Hwang, Pyeongtaek-si (KR); Chang-Gil Kwon, Namyangju-si (KR); Seung-Yeop Baek, Suwon-si (KR); Jae-Woo Lee, Anseong-si (KR); Ji-Sung Lee, Hwaseong-si (KR); Jae-Kwang Choi, Suwon-si (KR); Jin-Myung Hwang, Changwon-si (KR)

(73) Assignees: Samsung Electronics Co., Ltd., Suwon-si, Gyeonggi-Do (KR); K.C. Tech Co., Ltd., Anseong-si, Gyeonggi-Do (KR)

(*) Notice: Subject to any disclaimer, the term of this patent is extended or adjusted under 35 U.S.C. 154(b) by 0 days.

(21) Appl. No.: 15/214,847

(22) Filed: Jul. 20, 2016

(65) Prior Publication Data
US 2017/0029664 A1    Feb. 2, 2017

(30) Foreign Application Priority Data

Jul. 20, 2015 (KR) .................. 10-2015-0102312

(51) Int. Cl.
| | |
|---|---|
| H01L 21/31 | (2006.01) |
| H01L 21/76 | (2006.01) |
| H01L 21/82 | (2006.01) |
| C09G 1/02 | (2006.01) |
| H01L 21/762 | (2006.01) |
| H01L 29/06 | (2006.01) |
| H01L 21/3105 | (2006.01) |

(Continued)

(52) U.S. Cl.
CPC .......... *C09G 1/02* (2013.01); *H01L 21/31053* (2013.01); *H01L 21/76224* (2013.01); *H01L 21/76229* (2013.01); *H01L 21/823821* (2013.01); *H01L 29/0649* (2013.01); *H01L 29/66795* (2013.01); *H01L 29/785* (2013.01); *H01L 29/7853* (2013.01)

(58) Field of Classification Search
CPC .......... H01L 21/31; H01L 21/76; H01L 29/06
USPC ........................................................ 438/424
See application file for complete search history.

(56) References Cited

U.S. PATENT DOCUMENTS 5,895,509 A *   4/1999   Ohmi ................ C09K 3/1463
                                                    252/79.1
6,561,876 B1 *  5/2003   Tateyama .......... H01L 21/31053
                                                    257/E21.244

(Continued)

FOREIGN PATENT DOCUMENTS

| JP | 2007-214396 A | 8/2007 |
| JP | 2010-041024 A | 2/2010 |

(Continued)

*Primary Examiner* — Sheikh Maruf
(74) *Attorney, Agent, or Firm* — Lee & Morse, P.C.

(57) ABSTRACT

A polishing composition includes abrasive particles, a pyrrolidone containing a hydrophilic group, a dispersing agent, a first dishing inhibitor including polyacrylic acid, and a second dishing inhibitor including a non-ionic polymer.

14 Claims, 29 Drawing Sheets

(51) Int. Cl.
*H01L 29/78* (2006.01)
*H01L 21/8238* (2006.01)
*H01L 29/66* (2006.01)

(56) References Cited

U.S. PATENT DOCUMENTS

| | | | |
|---|---|---|---|
| 7,438,895 B2* | 10/2008 | Gallis | A61K 8/19 423/220 |
| 7,550,388 B2 | 6/2009 | Oh et al. | |
| 8,216,328 B2 | 7/2012 | Haerle et al. | |
| 8,314,030 B2 | 11/2012 | Park et al. | |
| 8,409,990 B2 | 4/2013 | Kraft | |
| 2002/0061608 A1* | 5/2002 | Kuroda | H01L 21/31053 438/129 |
| 2003/0181048 A1* | 9/2003 | Huang | H01L 21/76224 438/694 |
| 2004/0031206 A1 | 2/2004 | Uchino et al. | |
| 2004/0043613 A1 | 3/2004 | Bessho et al. | |
| 2004/0065022 A1* | 4/2004 | Machii | C09G 1/02 51/309 |
| 2004/0198191 A1 | 10/2004 | Bessho | |
| 2006/0024434 A1* | 2/2006 | Wang | C09C 1/3072 427/212 |
| 2006/0193764 A1* | 8/2006 | Katusic | B01J 23/10 423/263 |
| 2006/0216935 A1* | 9/2006 | Oswald | C09G 1/02 438/691 |
| 2006/0228999 A1* | 10/2006 | Ferranti | B24B 13/00 451/41 |
| 2006/0229000 A1* | 10/2006 | Izumi | B24B 37/24 451/41 |
| 2006/0289826 A1* | 12/2006 | Koyama | C09G 1/02 252/79.1 |
| 2007/0007246 A1* | 1/2007 | Idani | B24B 37/042 216/88 |
| 2007/0014740 A1* | 1/2007 | Miller | A61K 8/24 424/49 |
| 2007/0081931 A1 | 4/2007 | Cho et al. | |
| 2007/0212289 A1 | 9/2007 | Park et al. | |
| 2008/0197456 A1* | 8/2008 | Nakamura | C09G 1/02 257/632 |
| 2009/0113809 A1* | 5/2009 | Sakai | B82Y 30/00 51/309 |
| 2009/0130849 A1* | 5/2009 | Lee | B24B 37/044 438/693 |
| 2009/0133716 A1* | 5/2009 | Lee | C09G 1/02 134/3 |
| 2009/0165395 A1* | 7/2009 | Ikeda | C09G 1/02 51/309 |
| 2009/0325323 A1* | 12/2009 | Ueno | B24B 37/044 438/10 |
| 2010/0099260 A1* | 4/2010 | Matsumoto | C09G 1/02 438/693 |
| 2010/0102268 A1* | 4/2010 | Kroell | C09G 1/02 252/79.1 |
| 2010/0105595 A1* | 4/2010 | Lee | C09G 1/02 510/176 |
| 2010/0135921 A1* | 6/2010 | Hughes | A61K 8/25 424/49 |
| 2011/0039475 A1* | 2/2011 | Hoshi | B24B 37/044 451/28 |
| 2011/0053462 A1 | 3/2011 | Shida et al. | |
| 2011/0117720 A1* | 5/2011 | Choi | C01B 17/20 438/424 |
| 2012/0083188 A1* | 4/2012 | Kroell | C09G 1/02 451/28 |
| 2012/0164815 A1* | 6/2012 | Nishimura | H01L 21/31053 438/424 |
| 2012/0219606 A1* | 8/2012 | Deckner | A61K 8/25 424/401 |
| 2012/0270400 A1* | 10/2012 | Takegoshi | C09G 1/02 438/692 |
| 2013/0050366 A1* | 2/2013 | Sasada | C09D 11/101 347/100 |
| 2013/0140669 A1* | 6/2013 | Yugami | H01L 21/76224 257/506 |
| 2013/0200039 A1* | 8/2013 | Noller | C09G 1/02 252/79.1 |
| 2013/0248756 A1* | 9/2013 | Venkataraman | C09G 1/02 252/79.1 |
| 2015/0147884 A1* | 5/2015 | Kato | H01L 21/31053 438/693 |
| 2015/0185657 A1* | 7/2015 | Matsui | G03G 9/0833 430/105 |
| 2015/0214097 A1* | 7/2015 | Yin | H01L 21/76224 257/506 |
| 2015/0218709 A1* | 8/2015 | Yoshizaki | C09K 3/1436 252/79.2 |
| 2015/0315442 A1* | 11/2015 | Hofius | C09K 3/1427 51/308 |
| 2015/0331151 A1* | 11/2015 | Fukuda | G02B 1/04 428/1.1 |
| 2016/0137881 A1* | 5/2016 | Oota | C09K 3/1409 451/57 |
| 2016/0257855 A1* | 9/2016 | Reiss | B24B 37/044 |
| 2016/0257856 A1* | 9/2016 | Reiss | B24B 1/00 |
| 2016/0351388 A1* | 12/2016 | Liu | H01L 21/02074 |
| 2017/0033190 A1* | 2/2017 | Xie | H01L 29/408 |
| 2017/0154787 A1* | 6/2017 | Sakashita | B24B 37/00 |
| 2017/0178926 A1* | 6/2017 | Matsushita | H01L 21/02024 |
| 2017/0275498 A1* | 9/2017 | Tamada | C09G 1/02 |

FOREIGN PATENT DOCUMENTS

| | | |
|---|---|---|
| KR | 10-2003-0059243 A | 7/2003 |
| KR | 10-2004-0052209 A | 6/2004 |
| KR | 10-2004-0062417 A | 7/2004 |
| KR | 10-2004-0100281 A | 12/2004 |
| KR | 10-2007-0026145 A | 3/2007 |
| KR | 10-2014-0059345 A | 5/2014 |

* cited by examiner

POLISHING COMPOSITIONS AND METHODS OF MANUFACTURING SEMICONDUCTOR DEVICES USING THE SAME

CROSS-REFERENCE TO RELATED APPLICATION

Korean Patent Application No. 10-2015-0102312, filed on Jul. 20, 2015, in the Korean Intellectual Property Office, and entitled: "Polishing Compositions and Methods of Manufacturing Semiconductor Devices Using the Same," is incorporated by reference herein in its entirety.

BACKGROUND

1. Field

Example embodiments relate to polishing compositions and methods of manufacturing semiconductor devices.

2. Description of the Related Art

In a fabrication of a semiconductor device, a chemical mechanical polish (CMP) process may be performed for removing or planarizing stepped portions between layers formed on a substrate.

SUMMARY

Embodiments are directed to a polishing composition, including abrasive particles, a pyrrolidone containing a hydrophilic group, a dispersing agent, a first dishing inhibitor including polyacrylic acid, and a second dishing inhibitor including a non-ionic polymer.

A BET specific surface area before milling of the abrasive particle may be in a range from about 3 $m^2/g$ to about 8 $m^2/g$, and a BET specific surface area after milling of the abrasive particle may be about 10 $m^2/g$ or more.

The BET specific surface area after milling of the abrasive particle may be about 20 $m^2/g$ or more.

The pyrrolidone containing the hydrophilic group may include 1-2-hydroxyethyl-2-pyrrolidone.

The dispersing agent may include one or more of an anionic polymer neutralized by a compound including a hydroxyl group or an anionic polymer.

The dispersing agent may include one or more of a polyacrylic acid, a salt of the polyacrylic acid, a polymethacrylic acid, a salt of the polymethacrylic acid, a polyacrylic-maleic acid copolymer, or a salt of the polyacrylic-maleic acid copolymer.

The anionic polymer may have a weight average molecular weight in a range from about 10,000 to about 100,000.

The first dishing inhibitor may include a polyacrylic acid having a weight average molecular weight in a range from about 500 to about 10,000.

The second dishing inhibitor may include one or more of a polyethyleneglycol, a polyvinylalcohol, glycerine, a polypropyleneglycol, or a polyvinylpyrrolidone.

The second dishing inhibitor may include one or more of a polyethyleneglycol, a polyvinylalcohol, glycerine, a polypropyleneglycol, or a polyvinylpyrrolidone having a weight average molecular weight in a range from about 500 to about 10,000.

The composition may include about 0.1 weight percent to about 10 weight percent of the abrasive particles, about 0.01 weight percent to about 5 weight percent of the pyrrolidone containing the hydrophilic group, about 0.01 weight percent to about 10 weight percent of the dispersing agent, about 0.05 weight percent to about 5 weight percent of the first dishing inhibitor, about 0.0005 weight percent to about 0.1 weight percent of the second dishing inhibitor, and a remainder of a diluent, based on a total weight of the polishing composition.

Embodiments are also directed to a method of manufacturing a semiconductor device, the method including forming a mask pattern on a substrate, the mask pattern including a nitride, forming a trench by etching an upper portion of the substrate using the mask pattern, forming an oxide layer that fills the trench and covers the mask pattern, and planarizing the oxide layer using the mask pattern as a polishing-stopper and using a polishing composition, the polishing composition including abrasive particles, a pyrrolidone containing a hydrophilic group, a dispersing agent, a first dishing inhibitor including a polyacrylic acid, and a second dishing inhibitor including a non-ionic polymer.

Planarizing the oxide layer may include adjusting a dishing of the oxide layer with respect to a width of the trench below about 3/5000.

Planarizing the oxide layer may include polishing the oxide layer with a polishing selectivity of the oxide layer with respect to the mask pattern in a range from about 10 to about 50.

Forming the trench may include adjusting a pattern density in a range from about 5% to about 10%, the pattern density being defined as a ratio of a total area of the trench with respect to a unit area of the substrate in a plane view.

Embodiments are also directed to a composition, including a diluent, inorganic particles, a pyrrolidone monomer having one or more hydroxyl groups, a first polyacrylic acid having a weight average molecular weight in a range from about 500 to about 10,000, one or more of a second polyacrylic acid having a weight average molecular weight in a range from about 10,000 to about 100,000, an ammonium salt of the second polyacrylic acid, a polymethacrylic acid having a weight average molecular weight in a range from about 10,000 to about 100,000, an ammonium salt of the polymethacrylic acid, a polyacrylic-maleic acid copolymer having a weight average molecular weight in a range from about 10,000 to about 100,000, a salt of the polyacrylic-maleic acid copolymer, a carboxylic acid, a salt of a carboxylic acid, a sulfonic ester, a salt of a sulfonic ester, a sulfonic acid, a salt of a sulfonic acid, a phosphoric ester, or a salt of a phosphoric ester, provided that, when the composition includes the second polyacrylic acid or the second polyacrylic acid ammonium salt, then the second polyacrylic acid or ammonium salt thereof has a weight average molecular weight greater than that of the first polyacrylic acid, and one or more of a polyethyleneglycol, a polyvinylalcohol, glycerine, a polypropyleneglycol, or a polyvinylpyrrolidone.

The composition may have a pH that is in a range of about 6 to 7.

The pH of the composition may be basic or neutral.

The composition may have an etch selectivity for an oxide layer relative to a nitride layer such that the composition preferentially removes the oxide layer.

Embodiments are also directed to a semiconductor device manufactured by a method according to an embodiment.

BRIEF DESCRIPTION OF THE DRAWINGS

Features will become apparent to those of skill in the art by describing in detail example embodiments with reference to the attached drawings in which.

DETAILED DESCRIPTION

Figure 1:
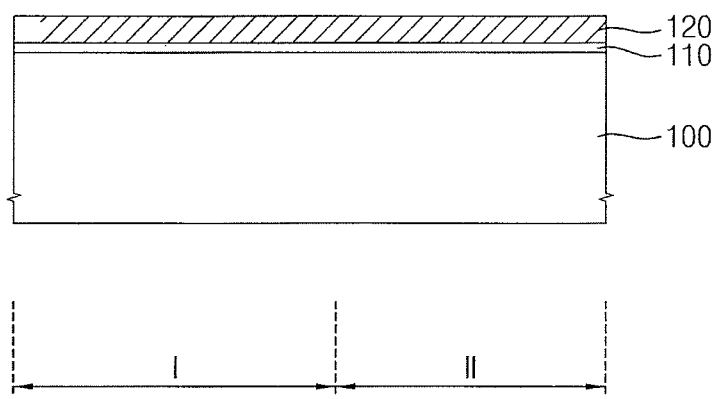
FIGS. 1 to 7 illustrate cross-sectional views illustrating a method of polishing a layer in accordance with example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art.

In the drawing figures, the dimensions of layers and regions may be exaggerated for clarity of illustration. Like reference numerals refer to like elements throughout.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth, etc., may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to example embodiments, a polishing composition may include an abrasive particle, a pyrrolidone containing a hydrophilic group, a dispersing agent, a first dishing inhibitor, and a second dishing inhibitor. The polishing composition may be provided as a slurry composition. In example embodiments, the polishing composition may have an improved polishing selectivity for an oxide layer relative to a nitride layer. Therefore, the nitride layer may serve as a polish-stop layer while performing a chemical mechanical polish (CMP) process using the polishing composition.

The abrasive particle may include, e.g., an inorganic oxide particle. In some embodiments, the abrasive particle may include ceria, silica, zirconia, alumina, titania, barium titania, germania, mangania, or magnesia. These may be used alone or in a combination thereof.

The abrasive particle may further include an organic coating layer or an inorganic coating layer thereon. The abrasive particle may be used as a colloidal formation. The abrasive particle may have any shape for facilitating an adhesion of the dispersing agent such as a spherical shape, a square shape, a needle shape, a plate shape or the like.

In some embodiments, an average diameter of a primary particle of the abrasive particle may be in a range from about 40 nm to about 100 nm, and an average diameter of a secondary particle may be in a range from about 60 nm to about 150 nm. If the average diameter of the primary particle is less than about 40 nm, a polishing rate may be excessively reduced. If the average diameter of the primary particle exceeds about 100 nm, particle uniformity may be degraded while preparing the polishing composition in a liquid state.

If the average diameter of the secondary particle is less than about 60 nm, a polishing selectivity may be excessively reduced. If the average diameter of the secondary particle exceeds about 150 nm, surface defects such as dishing may not be easily controlled.

In some embodiments, a BET specific surface area before milling of the abrasive particle may be equal to or less than about 8 $m^2/g$, and a BET specific surface area after milling may be at least about 10 $m^2/g$. The BET specific surface area of the abrasive particle may be adjusted in the above range, so that defects such as scratch or dishing at a surface of a polishing target layer, e.g., an oxide layer may be suppressed, and a dispersion of the abrasive particle, and an affinity with other components in the composition may be improved. For example, when the BET specific surface area after milling is increased above about 10 $m^2/g$, an adsorption of pyrrolidone and/or the dishing inhibitors may be improved, so that a polishing capability of the composition may be uniformly realized on an entire region of a substrate.

In some embodiments, the BET specific surface area before milling may be in a range from about 3 $m^2/g$ to about 8 $m^2/g$. If the BET specific surface area before milling is less than about 3 $m^2/g$, a process time or a process cost for preparing the abrasive particle may be excessively increased, and an overall process may become unstable. If the BET specific surface area exceeds about 8 $m^2/g$, a desired specific surface area after milling may not be easily obtained, and thus the dispersion of the abrasive particle and a dishing inhibition of the composition may be deteriorated.

In an embodiment, the BET specific surface area before milling of the abrasive particle may be in a range from about 3 $m^2/g$ to about 7 $m^2/g$. In an embodiment, the BET specific surface area before milling of the abrasive particle may be in a range from about 3 $m^2/g$ to about 5 $m^2/g$ If the BET specific surface area after milling of the abrasive particle becomes excessive, an aggregation between the other components in the composition may be caused. In some embodiments, the BET specific surface area after milling may be in a range from about 10 $m^2/g$ to about 30 $m^2/g$. In some embodiments, the BET specific surface area after milling may be at least about 20 $m^2/g$. In some embodiments, the BET specific surface area after milling may be in a range from about 20 $m^2/g$ to about 30 $m^2/g$.

In some embodiments, the amount of the abrasive particle in the polishing composition may be in a range from about 0.1 weight percent (wt %) to about 10 wt % based on a total weight of the composition. If the amount of the abrasive particle is less than about 0.1 wt %, a sufficient polishing rate may not be achieved. If the amount of the abrasive particle exceeds about 10 wt %, surface defects of the polishing target layer may be caused, and the polishing selectivity for the oxide layer relatively to the nitride layer may be reduced.

In example embodiments, the polishing composition may include pyrrolidone containing the hydrophilic group. In some embodiments, the pyrrolidone containing the hydrophilic group may include a pyrrolidone monomer containing a hydroxyl group. For example, pyrrolidone containing the hydrophilic group may include 1-2-hydroxyethyl-2-pyrrolidone, 4-hydroxy-2-pyrrolidone, hydroxymethyl pyrrolidone, hydroxyethyl pyrrolidone, N-hydroxymethyl-2-pyrrolidone or N-hydroxyethyl-2-pyrrolidone. These may be used alone or in a combination thereof.

In an embodiment, 1-2-hydroxyethyl-2-pyrrolidone may be used as pyrrolidone containing the hydrophilic group.

A within wafer non-uniformity (WIWNU) of a CMP process may be improved by the addition of pyrrolidone containing the hydrophilic group in the polishing composition.

For example, pyrrolidone containing the hydrophilic group may serve as a wetting agent, so that the polishing composition may have an enhanced flowability between a wafer and a pad of a polishing apparatus. Thus, the polishing composition may be dispersed and permeated uniformly in a region between the wafer and the pad. Therefore, the polishing target layer may be uniformly polished throughout an entire region of the wafer, and dishing or erosion of the oxide layer may be prevented at some regions, e.g., an edge area of the wafer.

An amount of pyrrolidone containing the hydrophilic group may be in a range from about 0.01 wt % to about 5 wt % based on the total weight of the polishing composition. In some embodiments, the amount of pyrrolidone containing the hydrophilic group may be in a range from about 0.1 wt % to about 2 wt %. If the amount of pyrrolidone containing the hydrophilic group is less than about 0.01 wt %, a dishing inhibition may not be substantially realized in the polishing composition. If the amount of pyrrolidone containing the hydrophilic group exceeds about 5 wt %, a side reaction in the polishing composition may occur from pyrrolidone containing the hydrophilic group to cause the aggregation.

The dispersing agent may be added in the polishing composition to facilitate a uniform dispersion of the abrasive particle, and increase a polishing efficiency or the polishing rate. For example, the dispersing agent may include polyacrylic acid, an ammonium salt of polyacrylic acid, polymethacrylic acid, an ammonium salt of polymethacrylic acid, polyacrylic-maleic acid copolymer, carboxylic acid, a salt of carboxylic acid, sulfonic ester, a sulfonic ester salt, a sulfonic acid a salt of sulfonic acid, phosphoric ester or a phosphoric ester salt. These may be used alone or in a combination thereof.

In some embodiments, the dispersing agent may include an anionic polymer such as polyacrylic acid, polymethacrylic acid, or polyacrylic-maleic acid copolymer, or a salt of the anionic polymer. In an embodiment, the dispersing agent may include an anionic polymer neutralized by a compound containing a hydroxyl group. The compound containing the hydroxyl group may include a metal hydroxide or ammonium hydroxide.

The polishing composition may include the anionic polymer as the dispersing agent, and thus the polishing composition may be uniformly coated on the oxide layer that may have a substantially partial negative charge.

In example embodiments, an amount of the dispersing agent may be in a range from about 0.01 wt % to about 10 wt % based on the total weight of the polishing composition. In some embodiments, the amount of the dispersing agent may be in a range from about 0.1 wt % to about 5 wt %. If the amount of the dispersing agent is less than about 0.01 wt %, the abrasive particle may not be sufficiently dispersed, and a sufficient protection of the nitride layer may not be achieved. If the amount of the dispersing agent exceeds about 10 wt %, an adsorption amount on the abrasive particle may be excessively increased to cause the aggregation, and defects such as scratches of the polishing target layer may be caused.

In some embodiments, the dispersing agent may include the anionic polymer having a weight average molecular weight in a range from about 10,000 to about 100,000. If the weight average molecular weight of the dispersing agent is less than about 10,000, a dispersion of the polishing composition may be reduced to cause a local dishing. If the weight average molecular weight of the dispersing agent exceeds about 100,000, the polishing rate may be excessively reduced.

In some embodiments, about 5 parts by weight to about 20 parts by weight of the total weight of the abrasive particle may be adsorbed with the dispersing agent.

In example embodiments, the first dishing inhibitor may include polyacrylic acid. In some embodiments, polyacrylic acid having a weight average molecular weight in a range from about 500 to about 10,000 may be used as the first dishing inhibitor. If the weight average molecular weight of the first dishing inhibitor is less than about 500, a sufficient dishing inhibition may not be realized. If the weight average molecular weight exceeds about 10,000, the polishing rate may be reduced, and the aggregation may be caused.

An amount of the first dishing inhibitor may be in a range from about 0.05 wt % to about 5 wt % based on the total weight of the polishing composition. If the amount of the first dishing inhibitor is less than about 0.05 wt %, the dishing inhibition of the polishing composition may be degraded. If the amount of the first dishing inhibitor exceeds about 5 wt %, a side reaction in the polishing composition may occur to cause the aggregation, and the polishing rate may be reduced.

In some embodiments, if the dispersing agent includes polyacrylic acid or the ammonium salt of polyacrylic acid, then the polyacrylic acid included in the first dishing inhibitor may have a weight average molecular weight less than that of polyacrylic acid included in the dispersing agent.

In example embodiments, the second dishing inhibitor may include a non-ionic polymer that may not create an anion or a cation in an aqueous solution. In some embodiments, the second dishing inhibitor may include polyethyleneglycol (PEG), polyvinylalcohol (PVA), glycerine, polypropyleneglycol (PPG) or polyvinylpyrrolidone (PVP). These may be used alone or in a combination thereof. In an embodiment, PEG may be used as the second dishing inhibitor.

The dispersion of the abrasive particle may be further improved by the second dishing inhibitor. Additionally, the polishing selectivity may be improved from an interaction with pyrrolidone containing the hydrophilic group and/or the first dishing inhibitor while suppressing the dishing.

For example, when an oxide layer is polished using a nitride layer pattern as a polish-stopper, the nitride layer pattern and the oxide layer may have a partial positive charge and a partial negative charge, respectively. For example, when the nitride layer pattern and the oxide layer are concurrently exposed during a CMP process, a buffer layer or a passivation layer may be commonly formed on the nitride layer pattern and the oxide layer because the second dishing inhibitor may include the non-ionic polymer. Therefore, a damage of the nitride layer pattern, and a dishing of the oxide layer may be minimized with an enhanced polishing selectivity.

In some embodiments, the second dishing inhibitor may include the non-ionic polymer having a weight average molecular weight in a range from about 500 to about 10,000. If the weight average molecular weight of the non-ionic polymer is less than about 500, buffer or passivation properties by the second dishing inhibitor may not be sufficiently realized, and the polishing selectivity may be reduced. If the weight average molecular weight of the non-ionic polymer exceeds about 10,000, a large amount of bubbles or foam may be created to deteriorate a polishing uniformity.

In some embodiments, an amount of the second dishing inhibitor may be in a range from about 0.0005 wt % to about 0.1 wt % based on the total weight of the polishing composition.

If the amount of the second dishing inhibitor is less than about 0.0005 wt %, a dispersion force may be reduced to cause a precipitation in the polishing composition. Accordingly, the abrasive particle may not be uniformly provided on the polishing target layer.

If the amount of the second dishing inhibitor exceeds about 0.1 wt %, a thickness of the buffer layer and the passivation layer may be excessively increased. Thus, the abrasive particle may not contact a surface of the polishing target layer, and the polishing rate may be reduced. Further, a dispersive stability of the polishing composition may be degraded to cause defects such as micro-scratches on the polishing target layer.

In some embodiments, the polishing composition may further include an ammonium salt.

For example, the ammonium salt may include ammonium nitrate, ammonium formate, ammonium citrate, ammonium acetate, ammonium benzoate, ammonium bromide, ammonium carbonate, ammonium chloride, ammonium chromate, ammonium dichromate, ammonium oxalate, ammonium sulfamate, ammonium sulfate, ammonium sulfite, ammonium tartrate, ammonium tetrafluoroborate, ammonium thiocyanate, ammonium thiosulfate, ammonium ascorbate, or the like. These may be used alone or in a combination thereof.

In some embodiments, the polishing composition may be prepared as a two-component type. For example, a first composition including the abrasive particle and the dispersing agent, and a second composition including the pyrrolidone containing the hydrophilic group, the first dishing inhibitor, and the second dishing inhibitor may be prepared. The first and second compositions may be mixed to form the polishing composition.

In some embodiments, a pH of the first composition may be in a range from about 7 to about 10, and a pH of the second composition may be in a range from about 2 to about 5. The polishing composition prepared by mixing the first and second compositions may have a pH in a range from about 6 to about 9.

In some embodiments, a pH adjusting agent may be added to achieve a target pH of the composition. For example, the pH adjusting agent may be added in the second composition so that the pH of the polishing composition may be adjusted.

In some embodiments, the pH adjusting agent may include an inorganic acid such as nitric acid, chloric acid, phosphoric acid, sulfuric acid, fluoric acid, bromic acid, iodic acid, or the like, or a salt of the inorganic acid. These may be used alone or in a combination thereof. In some embodiments, the pH adjusting agent may include an organic acid such as formic acid, malonic acid, maleic acid, oxalic acid, acetic acid, adipic acid, citric acid, propionic acid, fumaric acid, lactic acid, salicylic acid, pimelic acid, benzoic acid, succinic acid, phthalic acid, butyric acid, glutaric acid, glutamic acid, glycolic acid, asparaginic acid, tartaric acid, or the like, or a salt of the organic acid. These may be used alone or in a combination thereof.

A diluent such as a deionized water or an ammonia water may be used for preparing the polishing composition, or the first and second compositions.

The polishing composition according the example embodiments as described above may be utilized for a shallow trench isolation (STI) process or a formation of an interlayer dielectric (ILD) in a semiconductor fabrication. In some embodiments, a nitride layer may serve as a polish-stopper in the STI process or the formation of the ILD, and an oxide layer may be provided as a polish target layer.

In example embodiments, during a CMP process using the polishing composition, a dishing ratio of the oxide layer with respect to a pattern width may be limited below about 3/5,000, in some embodiments, below about 1/5,000. For example, a dishing of the oxide layer may be limited below about 300 Å, in some embodiments, below about 100 Å based on the pattern width of about 50 micrometer (μm).

In some embodiments, the dishing of the oxide layer by the polishing composition may be limited within a range from about 50 Å to about 300 Å based on the pattern width of about 50 μM. Accordingly, the dishing ration may be limited within a range from about 1/10,000 to about 3/5,000

In example embodiments, the polishing composition may be utilized in a CMP process for polishing the oxide layer formed on a substrate that may have a pattern density in a range from about 5% to about 10%. The pattern density may be a ratio of a total area of a trench that may be filled with the oxide layer with respect to a unit area of the substrate in a plane view.

In example embodiments, the polishing selectivity for the oxide layer with respect to the nitride layer may be in a range from about 10 to about 50. If the polishing selectivity is less than about 10, a polish-stopper property of the nitride layer may not be sufficiently realized. If the polishing selectivity exceeds about 50, the oxide layer may be excessively polished.

As described above, a selective polishing process of the oxide layer may be implemented with a high polishing rate using the polishing composition in accordance with example embodiments. The dishing of the oxide layer may be limited in a desired range even at an area having a low pattern density or a large pattern width so that a reliability of the semiconductor fabrication may be improved.

FIGS. 1 to 7 are cross-sectional views illustrating a method of polishing a layer in accordance with example embodiments. For example, FIGS. 1 to 7 illustrate an STI process using the polishing composition in accordance with example embodiments.

Referring to FIG. 1, a pad oxide layer 110 and a mask layer 120 may be formed on a substrate 100.

A semiconductor substrate including silicon, germanium, or silicon-germanium may be used as the substrate 100. A silicon-on-insulator (SOI) substrate or a germanium-on-insulator (GUI) substrate may be also used as the substrate 100. The substrate 100 may include a group III-V compound. e.g., InP, GaP, GaAs, GaSb, or the like. P-type or n-type impurities may be implanted at an upper portion of the substrate 100 to form a well.

The substrate 100 may be divided into a first region I and a second region II. In some embodiments, the first region I of the substrate 100 may be allotted as a device region in which a memory device or a logic device may be formed. The second region II of the substrate 100 may be allotted as a peripheral circuit region.

The pad oxide layer 110 and the mask layer 120 may be formed of silicon oxide and silicon nitride, respectively. The pad oxide layer 110 and the mask layer 120 may be formed by, e.g., a chemical vapor deposition (CVD) process, a sputtering process, an atomic layer deposition (ALD) process, etc. In some embodiments, the pad oxide layer 110 may be formed by thermally oxidizing a top surface of the substrate 100.

Figure 2:
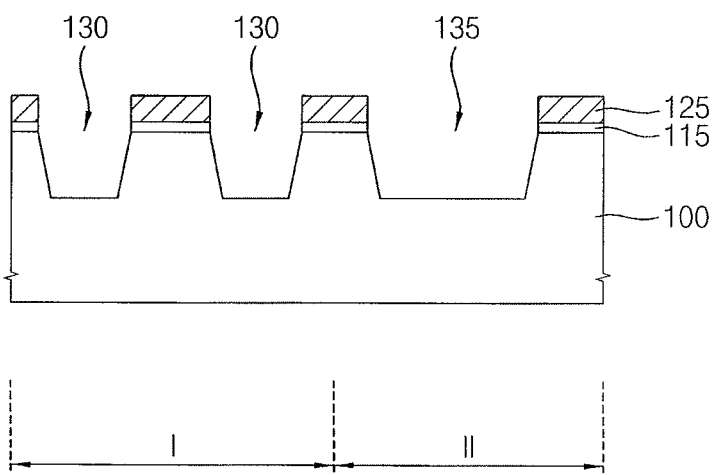

Referring to FIG. 2, an upper portion of the substrate 100 may be etched to form trenches 130 and 135.

In example embodiments, the mask layer 120 and the pad oxide layer 110 may be partially removed by a photolithography process to form a mask pattern 125 and a pad oxide pattern 115. The upper portion of the substrate 100 may be partially removed by an STI process using the mask pattern 125 and the pad oxide pattern 115 as an etching mask to form a first trench 130 and a second trench 135.

The first trench 130 and the second trench 135 may be formed at the first region I and the second region II, respectively. For example, the second trench 135 formed at the peripheral circuit region may have a width greater than a width of the first trench 130 formed at the device region.

In some embodiments, a pattern density defined as a ratio of a total area of the trenches 130 and 135 with respect to a unit area of the substrate 100 may be in a range from about 5% to about 10%.

Figure 3:
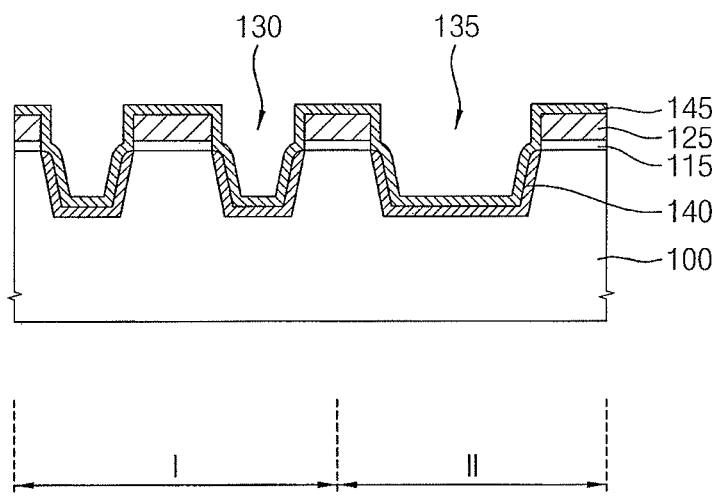

Referring to FIG. 3, liner may be formed on sidewalls of the trenches 130 and 135.

In example embodiments, first liners 140 may be formed on exposed sidewalls of the first and second trenches 130 and 135 by, e.g., a thermal oxidation process. For example, the first liner 140 may include silicon oxide.

A second liner 145 may be formed along the first liners 140, the pad oxide pattern 115, and the mask pattern 125. The second liner 145 may be formed of silicon nitride by, e.g., a CVD process or an ALD process.

Figure 4:
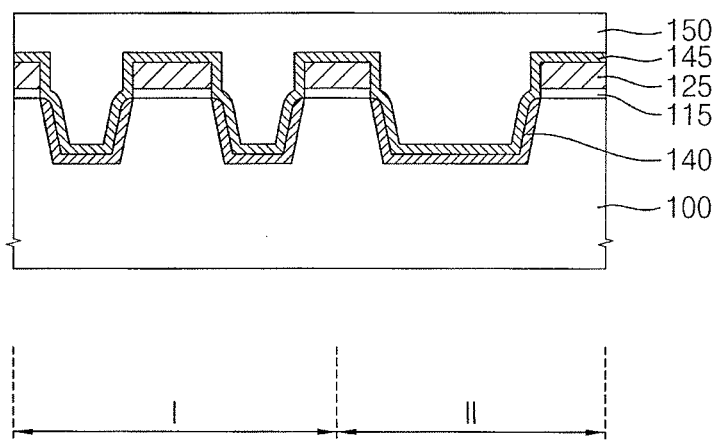

Referring to FIG. 4, an isolation layer 150 sufficiently filling the first and second trenches 130 and 135 may be formed on the second liner 145. The isolation layer 150 may be formed of a silicon oxide-based material, e.g., plasma enhanced oxide (PEOX), tetraethyl orthosilicate (TEOS), flowable oxide (FOX), silicate glass, or the like, by a CVD process.

Figure 5:
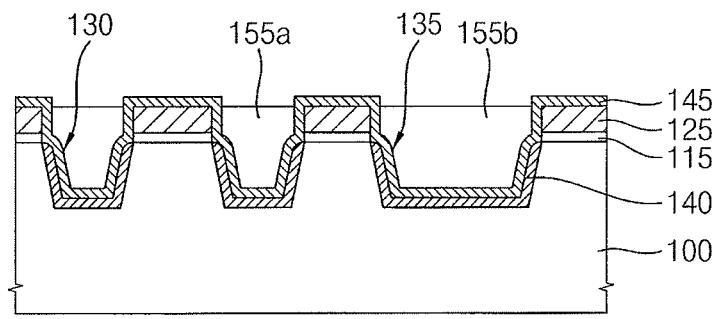
Figure 5:

Referring to FIG. 5, an upper portion of the isolation layer 150 may be planarized using the polishing composition in accordance with example embodiments. For example, a CMP process using the polishing composition may be performed to remove the upper portion of the isolation layer 150. The second liner 145 or the mask pattern 125 may serve as a polish-stop layer in the CMP process.

Accordingly, the isolation layer 150 may be divided into a first isolation layer 155a filling the first trench 130 at the first region I, and a second isolation layer 155b filling the second trench 135 at the second region II.

As described above, the polishing composition may include an abrasive particle, a pyrrolidone containing a hydrophilic group, a dispersing agent, a first dishing inhibitor, and a second dishing inhibitor. For example, 1-2-hydroxyethyl-2-pyrrolidone may be used as the pyrrolidone containing the hydrophilic group. The dispersing agent may include an anionic polymer having a weight average molecular weight in a range from about 10,000 to about 100,000. The first dishing inhibitor may include polyacrylic acid having a weight average molecular weight in a range from about 500 to about 10,000. The second dishing inhibitor may include a non-ionic polymer such as PEG.

A BET specific surface area before milling of the abrasive particle may be equal to or less than about 8 $m^2/g$, and a BET specific surface area after milling may be at least about 10 $m^2/g$. In some embodiments, the BET specific surface area before milling may be in a range from about 3 $m^2/g$ to about 8 $m^2/g$, and the BET specific surface area after milling may be at least about 20 $m^2/g$.

In some embodiments, the polishing composition may include about 0.1 wt % to about 10 wt % of the abrasive particle, about 0.01 wt % to about 5 wt % of pyrrolidone containing the hydrophilic group, about 0.01 wt % to about 10 wt % of the dispersing agent, about 0.05 wt % to about 5 wt % of the first dishing inhibitor, about 0.0005 wt % to about 0.1 wt % of the second dishing inhibitor, and a remainder of a diluent. based on a total weight of the polishing composition.

As described above, the polishing composition may have a high polishing selectivity for an oxide layer with respect to a nitride layer, and may have a low dishing ratio through an interaction of pyrrolidone containing the hydrophilic group, and the first and second dishing inhibitors. In example embodiments, the polishing composition may have the polishing selectivity for the oxide layer in a range from about 10 to about 50, and the dishing ratio of the oxide layer with respect to a pattern width may be limited below about 3/5,000.

Accordingly, a dishing may be prevented even at the second region II having a relatively large pattern width (e.g., a width of the trench) so that the first isolation layer 155a and the second isolation layer 155b having a uniform upper surface throughout the first and second regions I and II may be formed.

In some embodiments, top surfaces of the first isolation layer 155a and the second isolation layer 155b may have a height substantially the same as a height of a top surface of the mask pattern 125.

Figure 6:
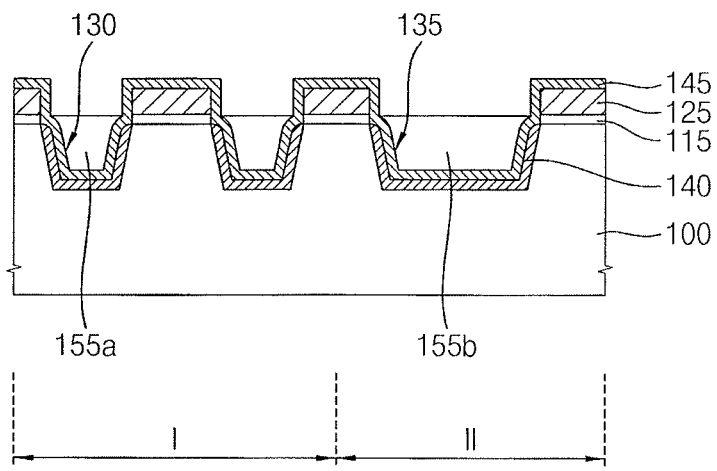
Figure 6:
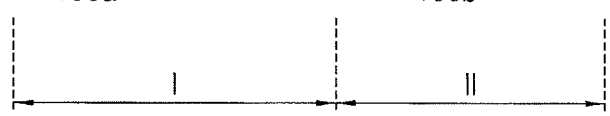

Referring to FIG. 6, e.g., an etch-back process or an additional CMP process may be performed to remove upper portions of the first and second isolation layers 155a and 155b. In some embodiments, top surfaces of the first and second isolation layers 155a and 155b may be coplanar with a top surface of the pad oxide pattern 115.

Figure 7:
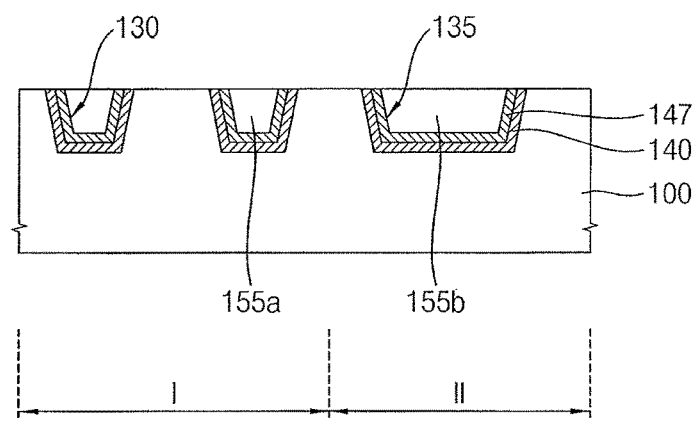

Referring to FIG. 7, an upper portion of the second liner 145, the mask pattern 125, and the pad oxide pattern 115 may be removed. In some embodiments, the first and second isolation layers 155a and 155b may be additionally polished or planarized until a top surface of the substrate 100 may be exposed.

Accordingly, the first liner 140 and a second liner pattern 147 may remain in the first and second trenches 130 and 135, and the first and second isolation layers 155a and 155b that may be substantially coplanar with the top surface of the substrate 100 may be formed.

As described above, a dishing of an oxide layer (e.g., the isolation layer 150) may be suppressed and a polishing efficiency may be increased using the polishing composition according to example embodiments. Thus, an etching amount of the first and second isolation layers 155a and 155b may be finely controlled in subsequent processes illustrated in FIGS. 6 and 7, and a reliability of a device isolation process may be improved.

FIGS. 8 to 31 are top plan views and cross-sectional views illustrating a method of manufacturing a semiconductor device in accordance with example embodiments. For example, FIGS. 8 to 31 illustrate a method of manufacturing a semiconductor device including a fin field-effect transistor (FinFET).

Figure 8:
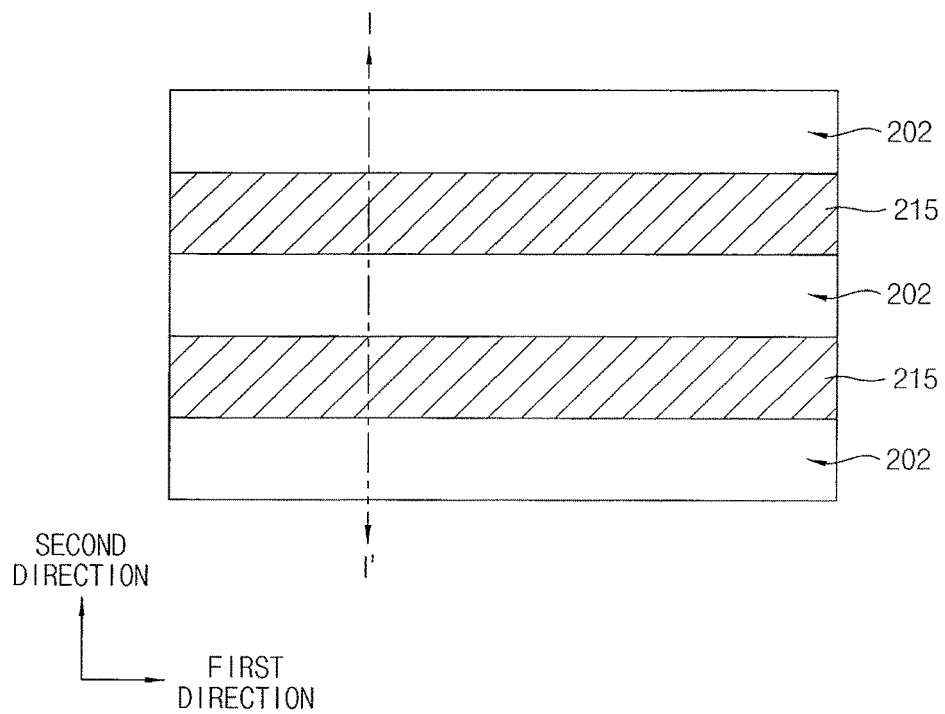
FIGS. 8 to 31 illustrate top plan views and cross-sectional views illustrating a method of manufacturing a semiconductor device in accordance with example embodiments.
Figure 13:
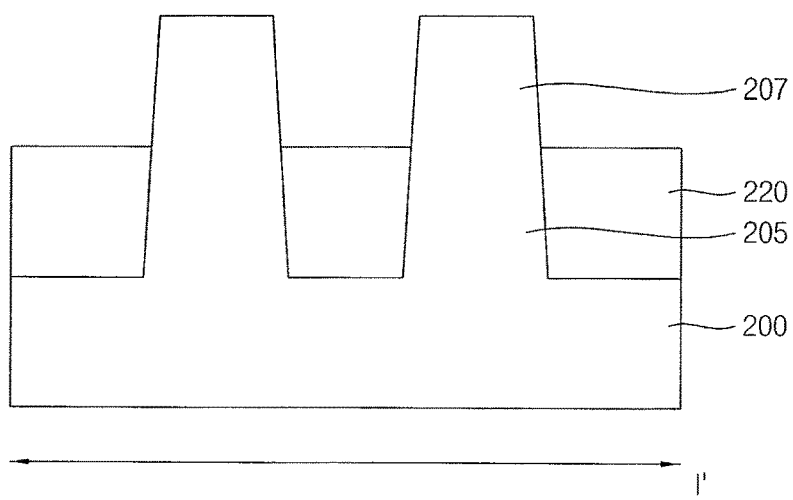
Figure 13:
Figure 14:
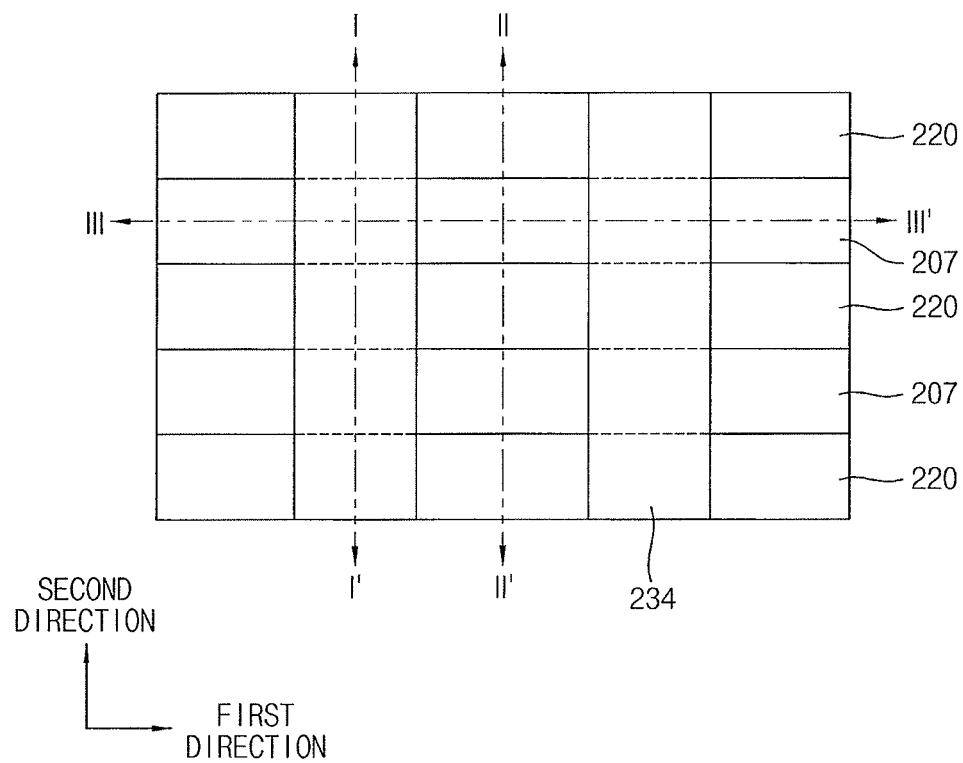
Figure 16:
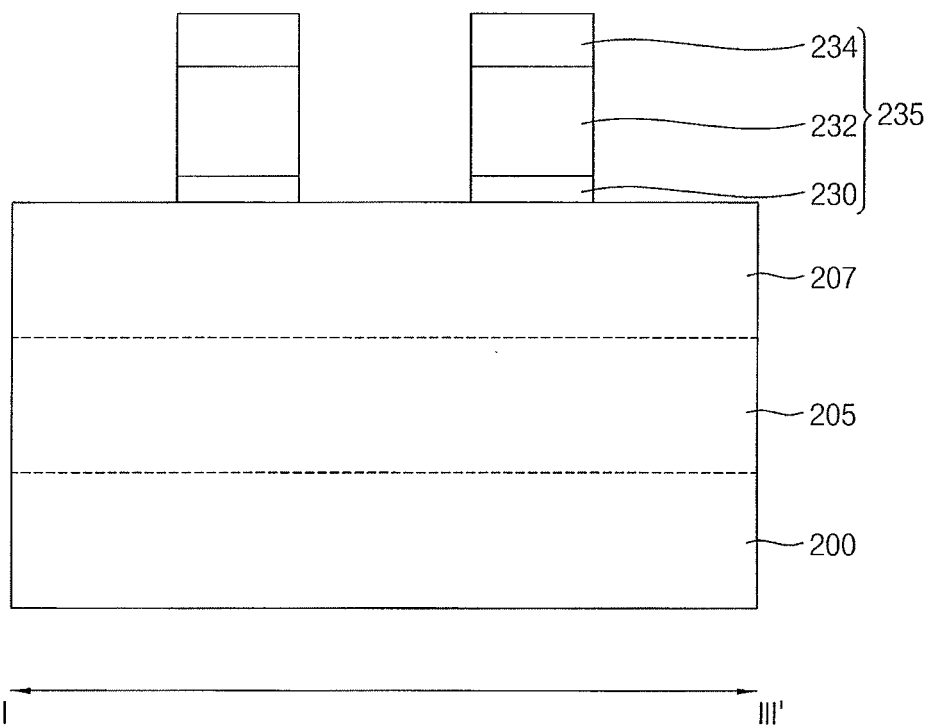
Figure 17:
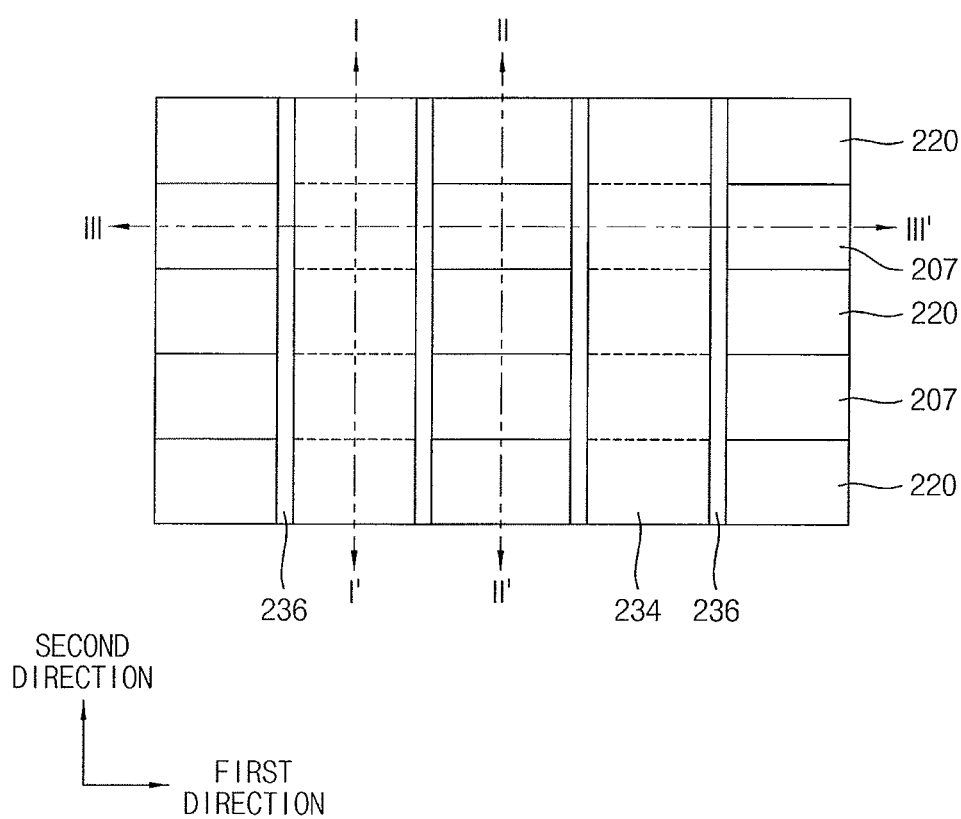

Specifically, FIGS. 8, 14 and 17 are top plan views illustrating the method. FIGS. 9 to 13 are cross-sectional views taken along a line I-I' indicated in FIG. 8. FIGS. 15, 19, 21, 25, 27 and 29 include cross sectional views taken along lines I-I' and II-II' indicated in FIGS. 14 and 17. FIGS. 16, 18, 20, 22 to 24, 26, 28, 30, and 31 are cross-sectional views taken along a line indicated in FIGS. 14 and 17.

In FIGS. 8 to 31, two directions substantially parallel to a top surface of a substrate and substantially perpendicular to each other are referred to as a first direction and a second direction. The direction indicated by an arrow and a reverse direction thereof are considered as the same direction.

Figure 9:
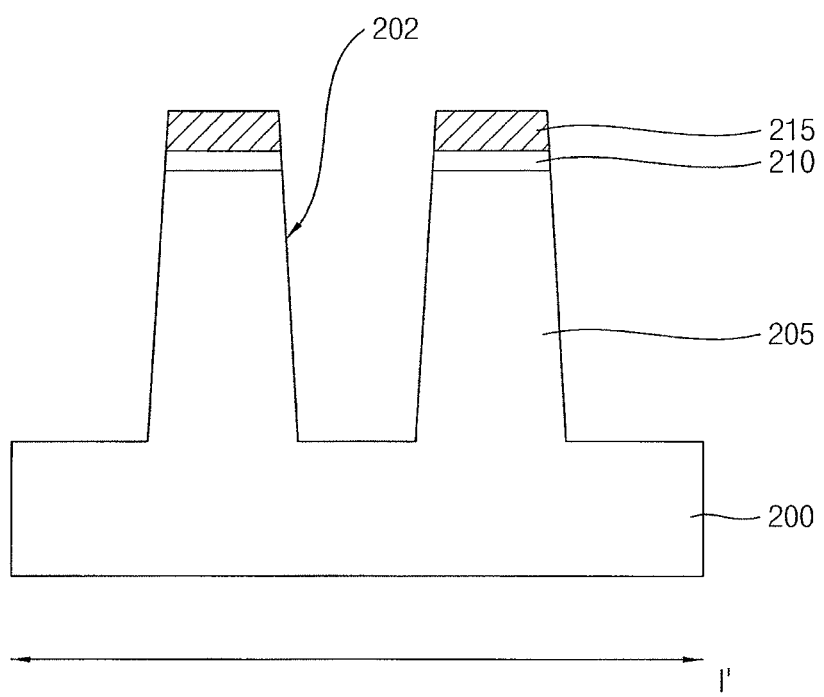

Referring to FIGS. 8 and 9, an active pattern 205 protruding from a substrate 200 may be formed.

The substrate 200 may include a semiconductor material such as silicon, germanium, silicon-germanium, or a group III-V compound such as InP, GaP, GaAs, GaSb, etc. In some embodiments, the substrate 200 may include an SOI substrate or a GOI substrate.

In example embodiments, the active pattern 205 may be formed by a shallow trench isolation (STI) process. For example, a pad oxide layer 210 may be formed on a top surface of the substrate 200, and a mask pattern 215 including silicon nitride may be formed on the pad oxide layer 210. The pad oxide layer 210 and an upper portion of the substrate 200 may be partially etched using the mask pattern 215 as an etching mask to form an isolation trench 202.

A plurality of protrusions may be formed from the substrate 200 by the formation of the isolation trench 202. The protrusions may be defined as the active patterns 205. Each active pattern 205 may extend linearly in the first direction, and a plurality of the active patterns 205 may be formed along the second direction.

In some embodiments, the isolation trench 202 formed at, e.g., a peripheral circuit region may have a relatively large width, and thus a distance between the neighboring active patterns 205 may be increased.

In some embodiments, as also illustrated with reference to FIG. 3, a liner may be further formed on a sidewall of the isolation trench 202.

Figure 10:
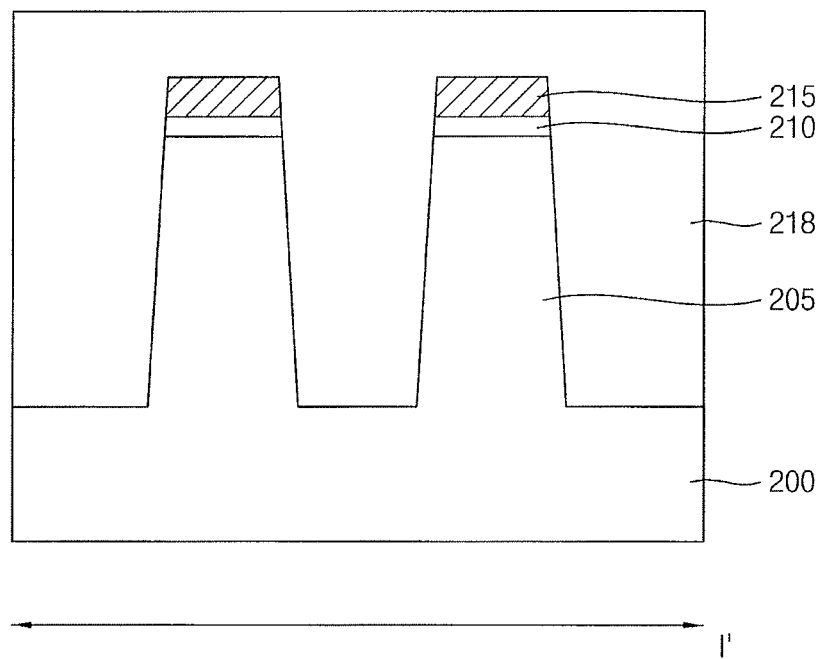

Referring to FIG. 10, a first oxide layer 218 filling the isolation trenches 202, and covering the active pattern 205 and the mask pattern 215 may be formed on the substrate 200. The first oxide layer 218 may be formed of a silicon oxide-based material by, e.g., a CVD process or an ALD process.

Figure 11:
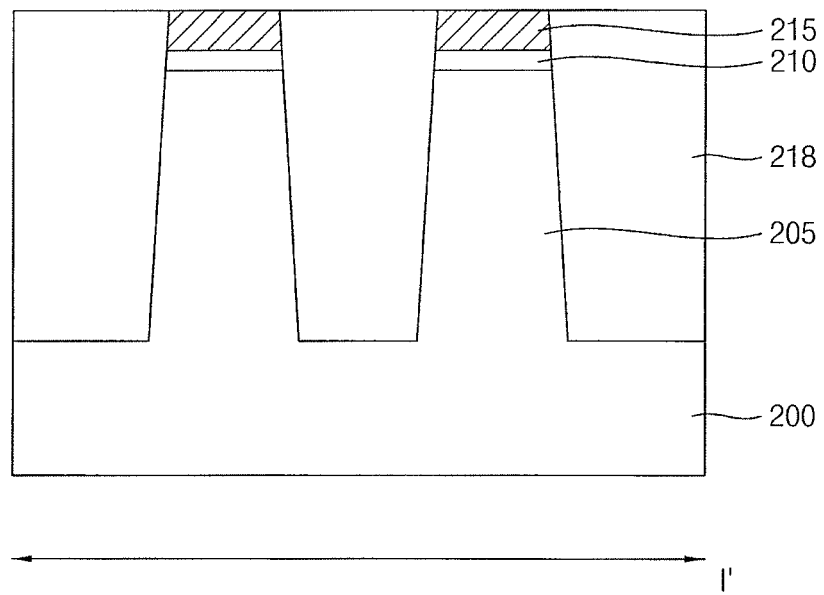

Referring to FIG. 11, a process substantially the same as or similar to that illustrated with reference to FIG. 5 may be performed.

In example embodiments, an upper portion of the first oxide layer 218 may be planarized using the polishing composition as described above. For example, the upper portion of the first oxide layer 218 may be polished by a CMP process using the polishing composition until a top surface of the mask pattern 215 may be exposed.

As described above, the polishing composition may include an abrasive particle, pyrrolidone containing a hydrophilic group, a dispersing agent, a first dishing inhibitor, and a second dishing inhibitor. For example, 1-2-hydroxyethyl-2-pyrrolidone may be used as the pyrrolidone containing hydrophilic group. The dispersing agent may include an anionic polymer having a weight average molecular weight in a range from about 10,000 to about 100,000. The first dishing inhibitor may include polyacrylic acid having a weight average molecular weight in a range from about 500 to about 10,000. The second dishing inhibitor may include a non-ionic polymer such as PEG.

A BET specific surface area before milling of the abrasive particle may be equal to or less than about 8 $m^2/g$, and a BET specific surface area after milling may be at least about 10 $m^2/g$. In some embodiments, the BET specific surface area before milling may be in a range from about 3 $m^2/g$ to about 8 $m^2/g$, and the BET specific surface area after milling may be at least about 20 $m^2/g$.

In some embodiments, the polishing composition may include about 0.1 wt % to about 10 wt % of the abrasive particle, about 0.01 wt % to about 5 wt % of pyrrolidone containing the hydrophilic group, about 0.01 wt % to about 10 wt % of the dispersing agent, about 0.05 wt % to about 5 wt % of the first dishing inhibitor, about 0.0005 wt % to about 0.1 wt % of the second dishing inhibitor, and a remainder of a diluent, based on a total weight of the polishing composition.

In some embodiments, the polishing composition may have a polishing selectivity for an oxide layer with respect to a nitride layer in a range from about 10 to about 50, and a dishing ratio of the oxide layer with respect to a pattern width (e.g., the distance between the neighboring active patterns 205 or the width of the isolation trench 202) may be limited below about 3/5,000.

For example, a pattern density defined as a ratio of a total area of the isolation trenches 202 with respect to a unit area of the substrate 200 may be in a range of about 5% to about 10%.

Accordingly, in a FinFET having a critical dimension, e.g., below about 20 nm and having the pattern density of the above range, a dishing may be substantially suppressed while polishing the first oxide layer 218. Thus, an isolation layer 220 (see FIG. 12) uniformly planarized throughout an entire region of the substrate 200 may be achieved.

Figure 12:
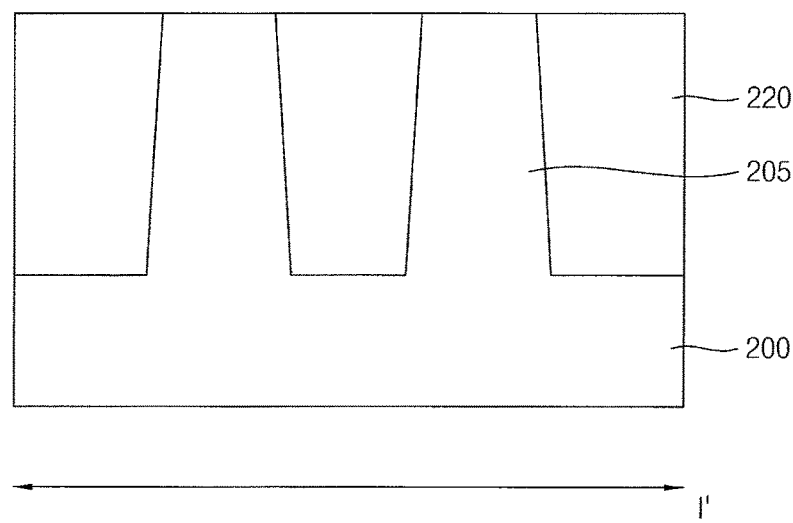
Figure 12:

Referring to FIG. 12, for example, processes substantially the same as or similar to those illustrated with reference to FIGS. 6 and 7 may be performed to form the isolation layer 220.

In some embodiments, a portion of the first oxide layer 218 between the neighboring mask patterns 215 may be recessed, and the mask pattern 215 and the pad oxide layer 210 may be removed. Accordingly, the isolation layer 220 having a top surface substantially coplanar with that of the substrate 200 may be formed.

Referring to FIG. 13, an upper portion of the isolation layer 202 may be removed by, e.g., an etch-back process so that an upper portion of the active pattern 205 may be exposed. The upper portion of the active pattern 205 exposed from the top surface of the isolation layer 202 may be defined as an active fin 207. The active fin 207 may extend in the first direction, and a plurality of the active fins 207 may be arranged along the second direction.

Figure 15:
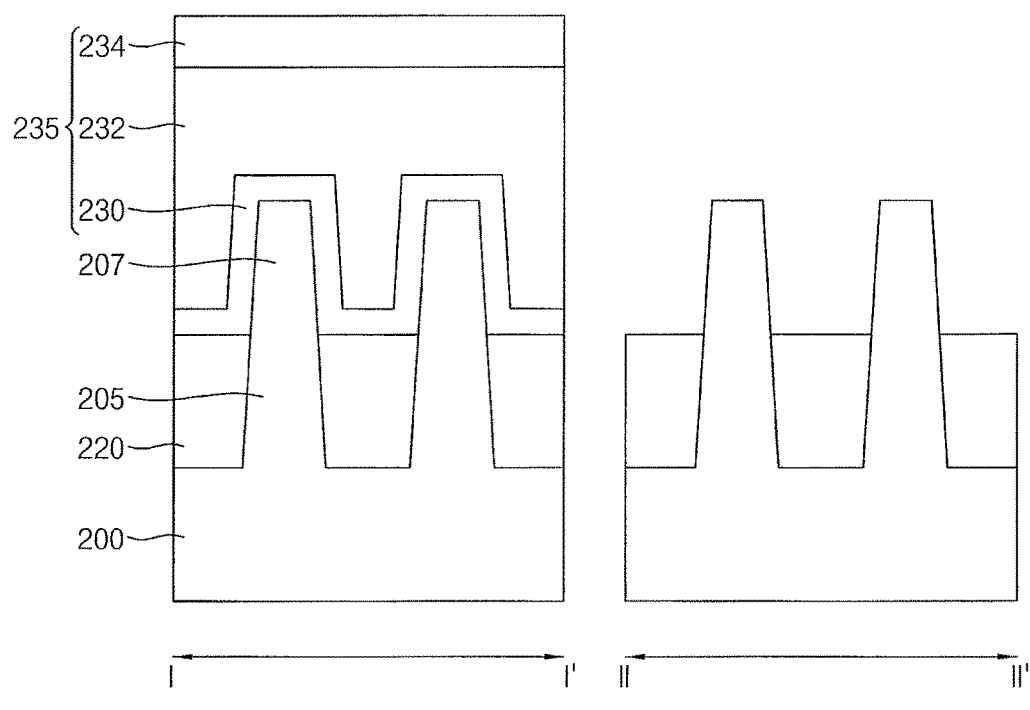

Referring to FIGS. 14, 15 and 16, a dummy gate structure 235 may be formed on the isolation layer 202 and the active fin 207.

For example, a dummy gate insulation layer, a dummy gate electrode layer, and a dummy gate mask layer may be sequentially formed on the active fin 207 and the isolation layer 202. The dummy gate mask layer may be patterned by a photo-lithography process to form a dummy gate mask 234. The dummy gate electrode layer and the dummy gate insulation layer may be partially removed using the dummy gate mask 234 as an etching mask to form the dummy gate structure 235.

Accordingly, the dummy gate structure 235 may include a dummy gate insulation pattern 230, a dummy gate electrode 232 and the dummy gate mask 234 sequentially stacked from the active fin 207 and the isolation layer 220.

For example, the dummy gate insulation layer may be formed of silicon oxide.

The dummy gate electrode layer may be formed of polysilicon. The dummy gate mask layer may be formed of silicon nitride.

The dummy gate insulation layer, the dummy gate electrode layer, and the dummy gate mask layer may be formed by a CVD process, a sputtering process, or an ALD process. In an embodiment, the dummy gate insulation layer may be formed by a thermal oxidation process on the active fin 207.

In this case, the dummy gate insulation layer may be selectively formed on a top surface of the active fin 207.

In example embodiments, the dummy gate structure 235 may extend in the second direction, and may cross a plurality of the active fins 207. A plurality of the dummy gate structures 235 may be formed along the first direction.

Figure 18:
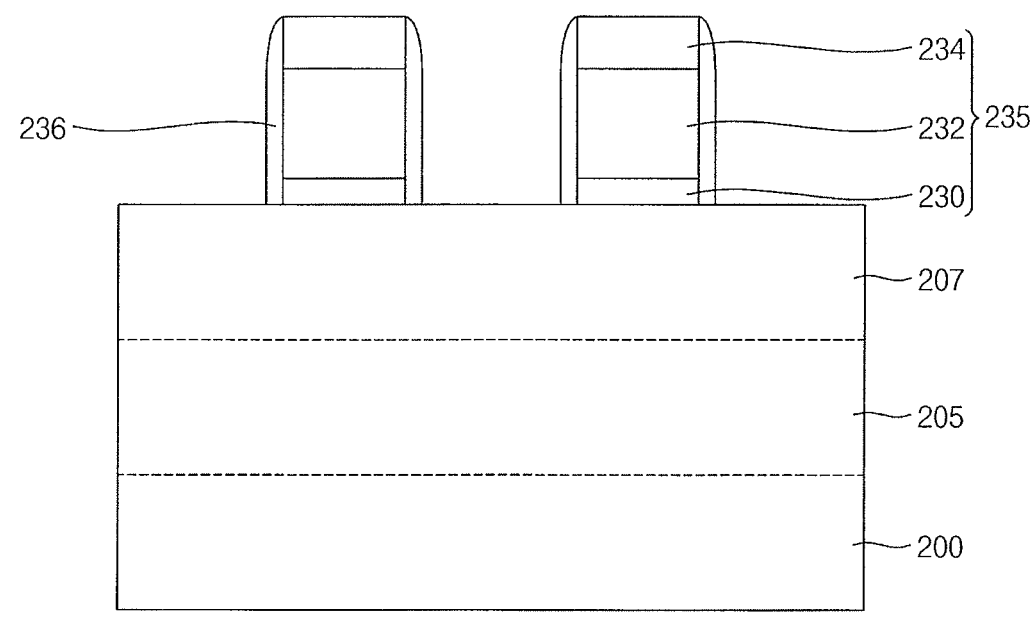
Figure 18:

Referring to FIGS. 17 and 18, a gate spacer 236 may be formed on a sidewall of the dummy gate structure 235.

In example embodiments, a spacer layer may be formed on the dummy gate structure 235, the active fin 207, and the isolation layer 220, and the spacer layer may be anisotropically etched to form the gate spacer 236. The spacer layer may be formed of a nitride, e.g., silicon nitride, silicon oxynitride, silicon carbonitride, etc.

As illustrated in FIG. 17, the gate spacer 236 may extend in the second direction together with the dummy gate structure 235.

Figure 19:
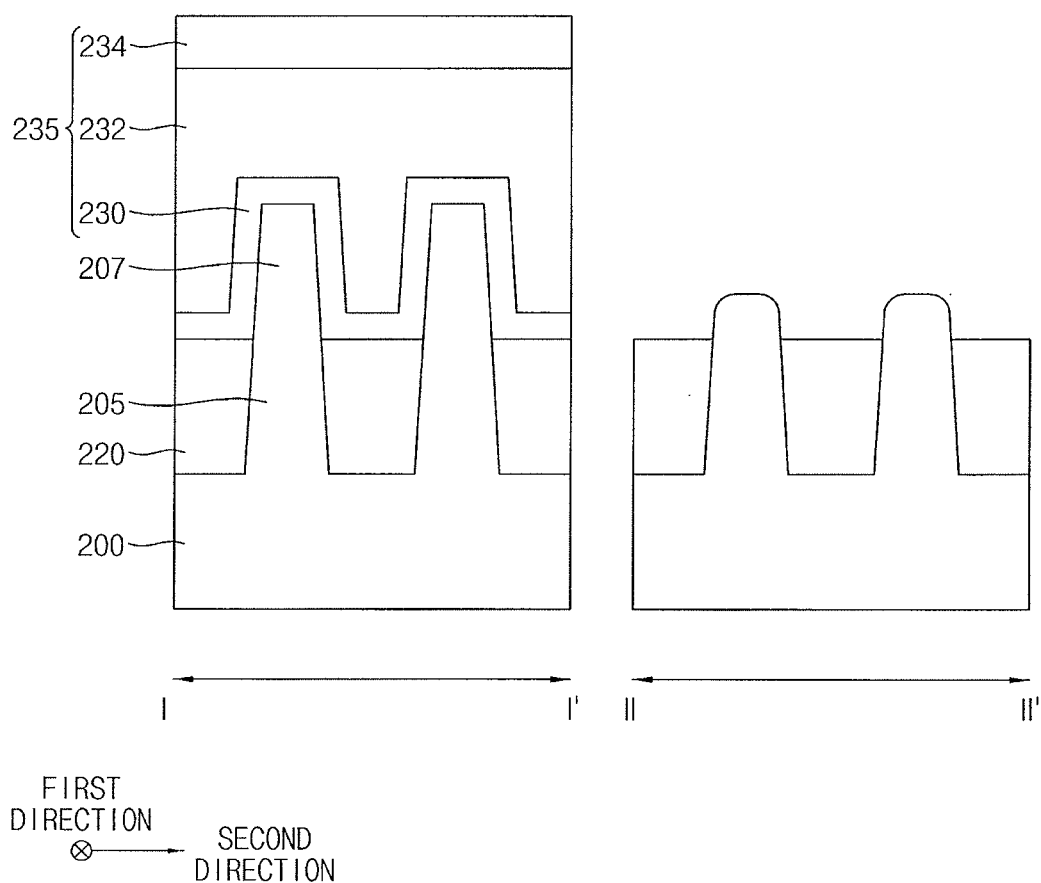
Figure 20:
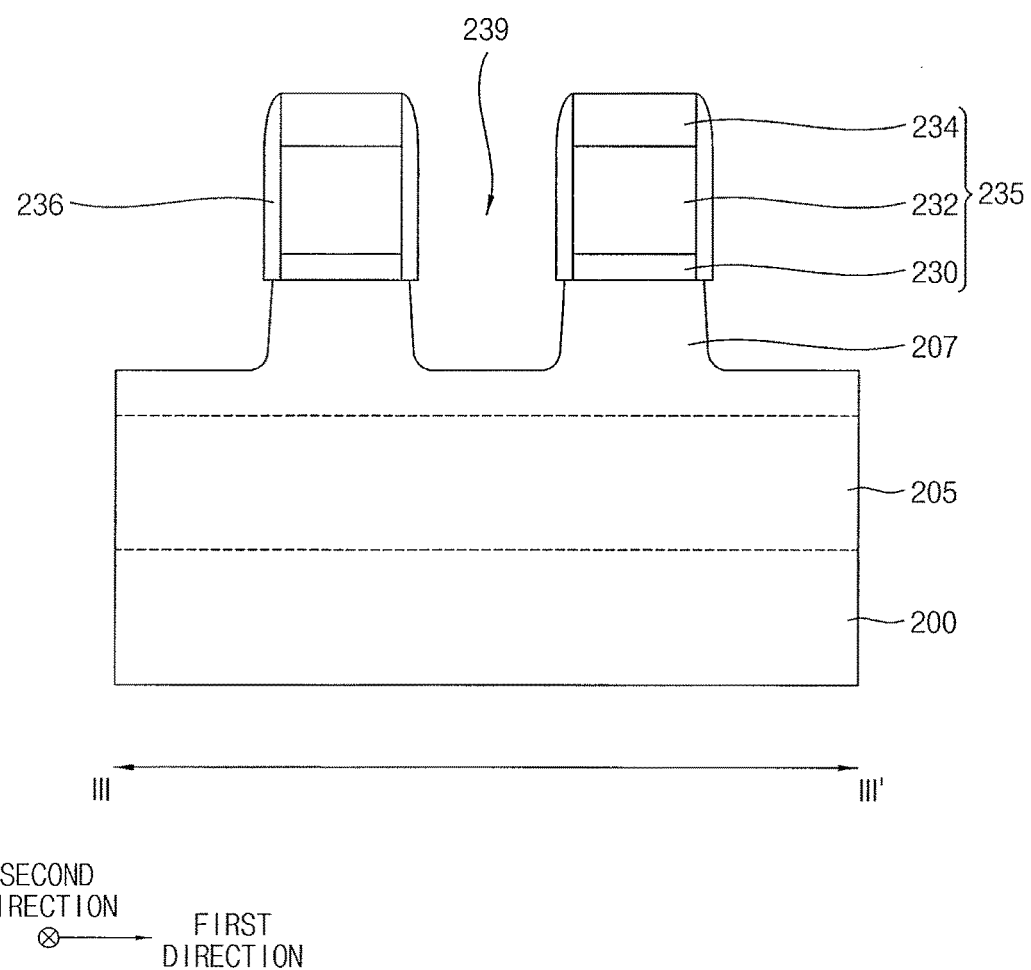

Referring to FIGS. 19 and 20, an upper portion of the active fin 207 adjacent to the gate spacer 236 and/or the dummy gate structure 235 may be etched to form a recess 239.

In the etching process for the formation of the recess 239, the gate spacer 236 may substantially serve as an etching mask. In example embodiments, an inner wall of the recess 239 may have a substantially "U"-shaped profile as illustrated in FIG. 20.

Figure 21:
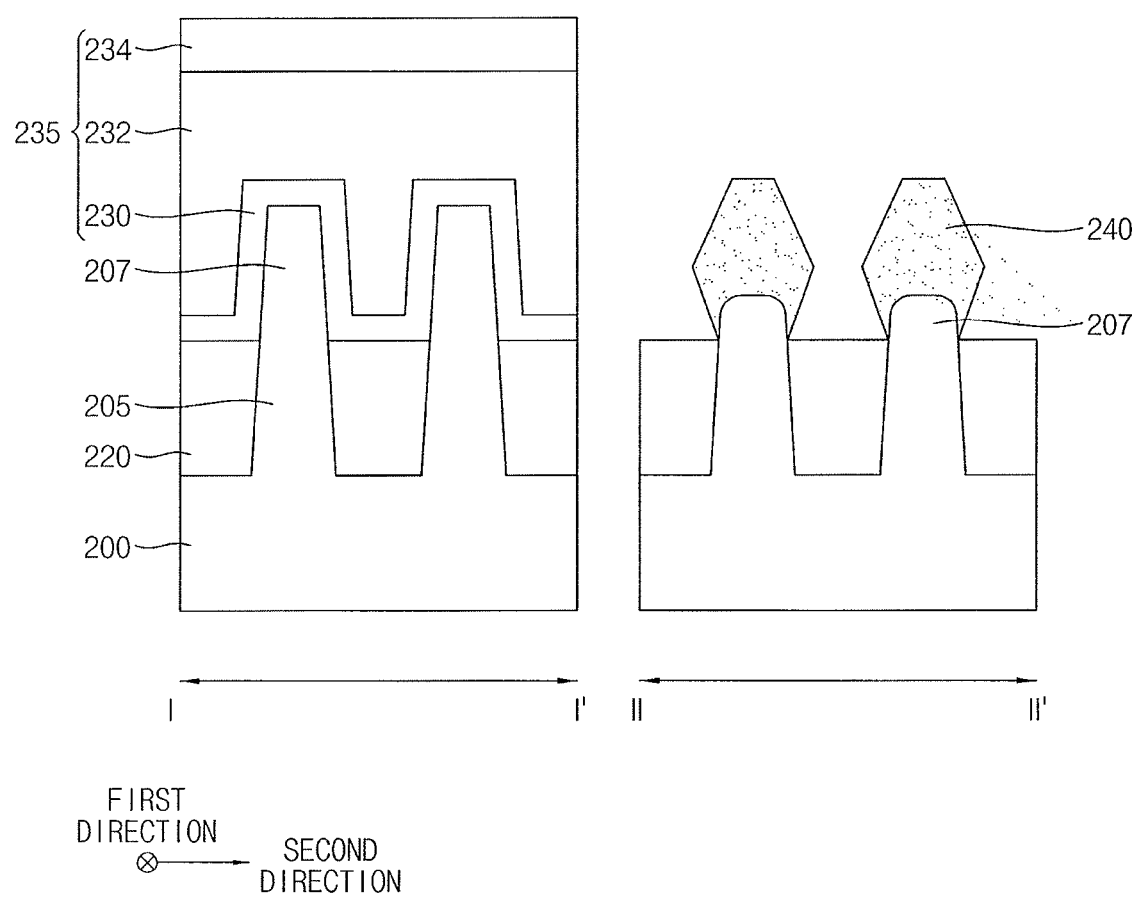
Figure 22:
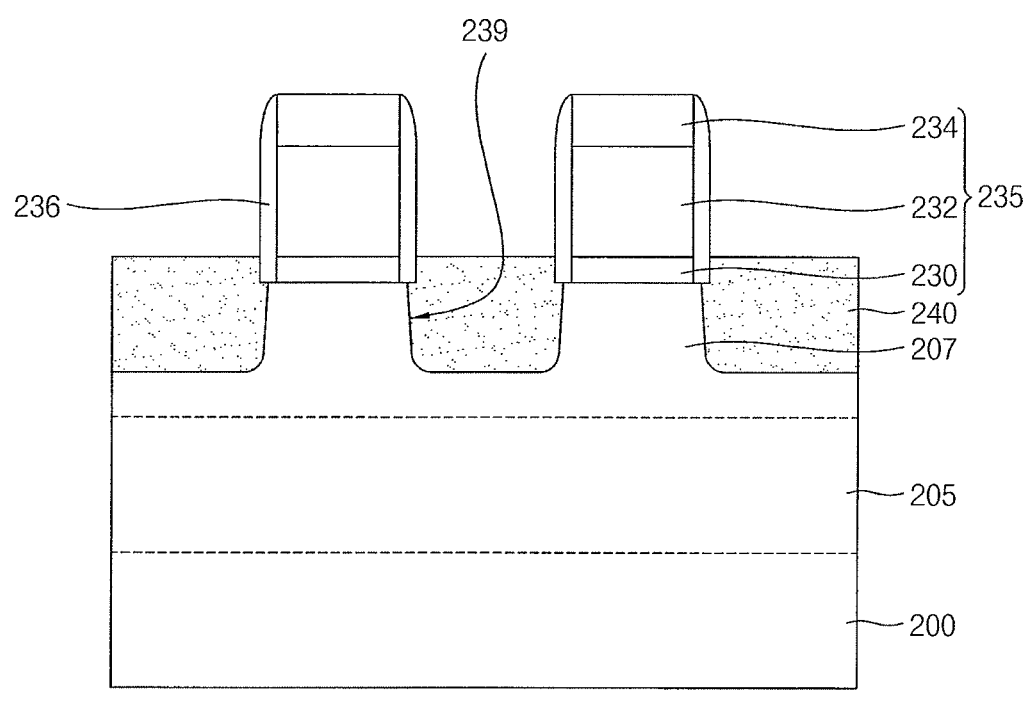

Referring to FIGS. 21 and 22, a source/drain layer 240 filling the recess 239 may be formed.

In example embodiments, the source/drain layer 240 may be formed by a selective epitaxial growth (SEG) process using the top surface of the active fin 207 exposed by the recess 239 as a seed.

In some embodiments, an n-type impurity source such as phosphine ($PH_3$) or a p-type impurity source such as diborane ($B_2H_6$) may be implanted together with a silicon source such as a silane-based compound in the SEG process.

The source/drain layer 240 may be grown vertically and laterally to have, e.g., a polygonal cross-section as illustrated in FIG. 21. In some embodiments, the source/drain layer 240 may sufficiently fill the recess 239 to contact a lower portion of the gate spacer 236.

As illustrated in FIG. 21, one source/drain layer 240 may be formed per each active fin 207. However, the one source/drain layer 240 may be formed from a plurality of the active fins 207. For example, two source/drain layers 240 neighboring in the second direction may be merged with each other.

Figure 23:
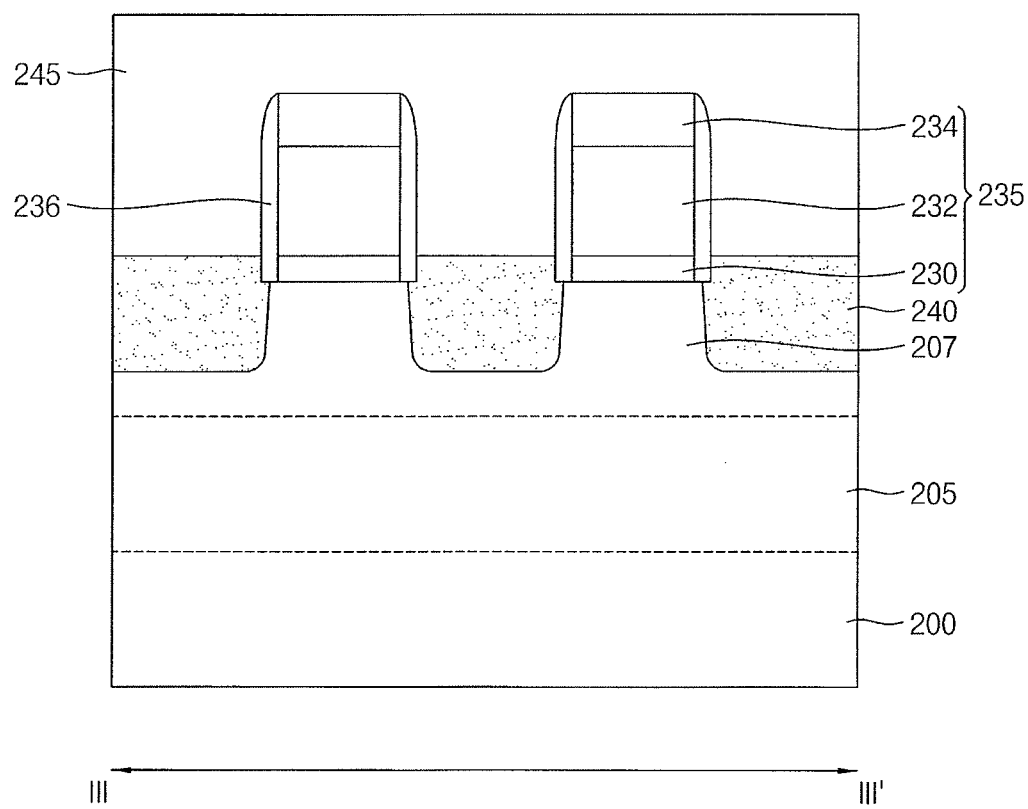

Referring to FIG. 23, a second oxide layer 245 covering the dummy gate structure 235, the gate spacer 236 and the source/drain layers 240 may be formed on the active fin 207 and the isolation layer 220.

In example embodiments, the second oxide layer 245 may be formed of a silicon oxide-based material such as PEOX, TEOS, FOX, or silicate glass by, e.g., a CVD process.

Figure 24:
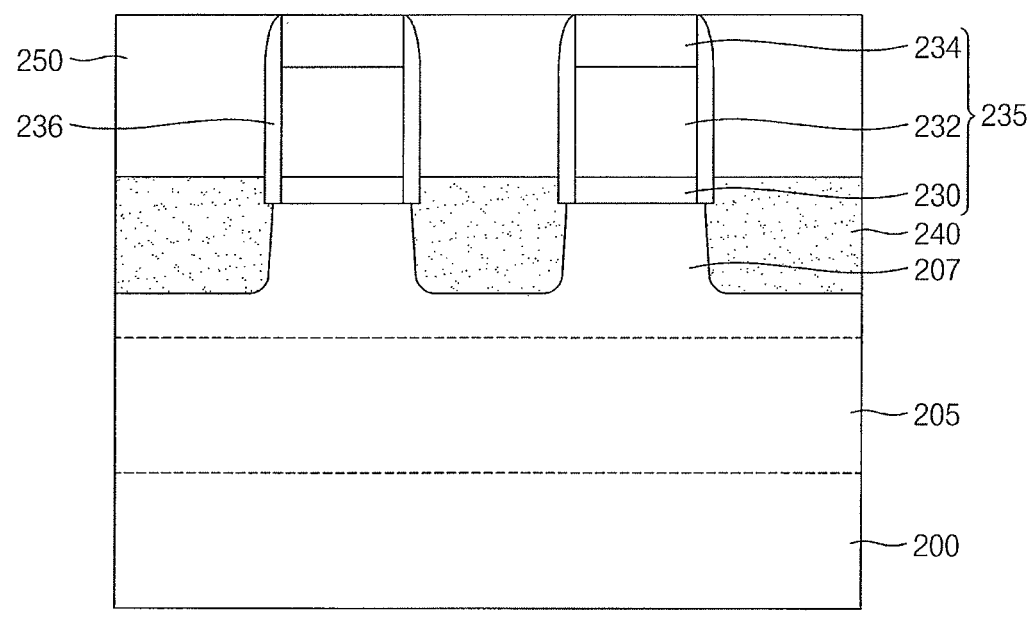

Referring to FIG. 24, an upper portion of the second oxide layer 245 may be planarized to form an insulating interlayer 250.

In example embodiments, the upper portion of the second oxide layer 245 may be planarized using the polishing composition as described above. For example, the upper portion of the second oxide layer 245 may be polished by a CMP process using the polishing composition until top surfaces of the dummy gate mask 234 and/or the gate spacer 236 may be exposed.

As described above, while polishing the second oxide layer 245, a dishing may be substantially suppressed, and the insulating interlayer 250 may have a substantially planar and uniform upper surface.

Figure 25:
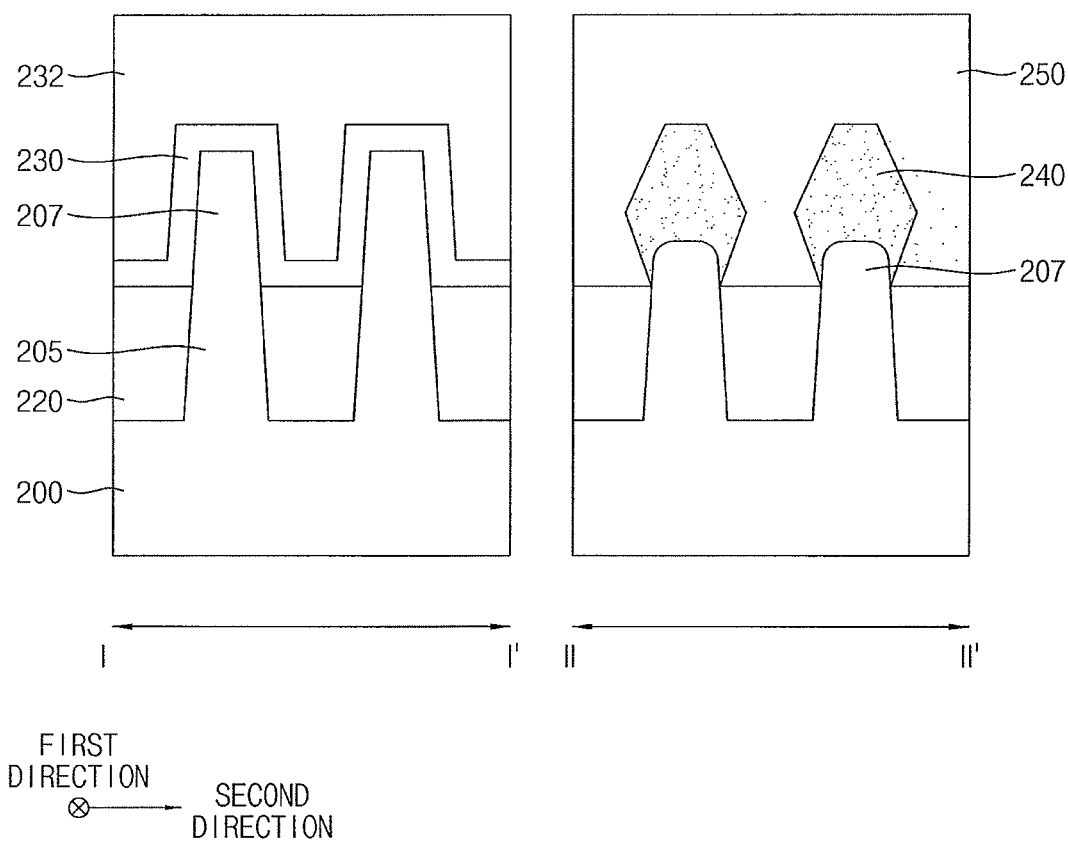
Figure 26:
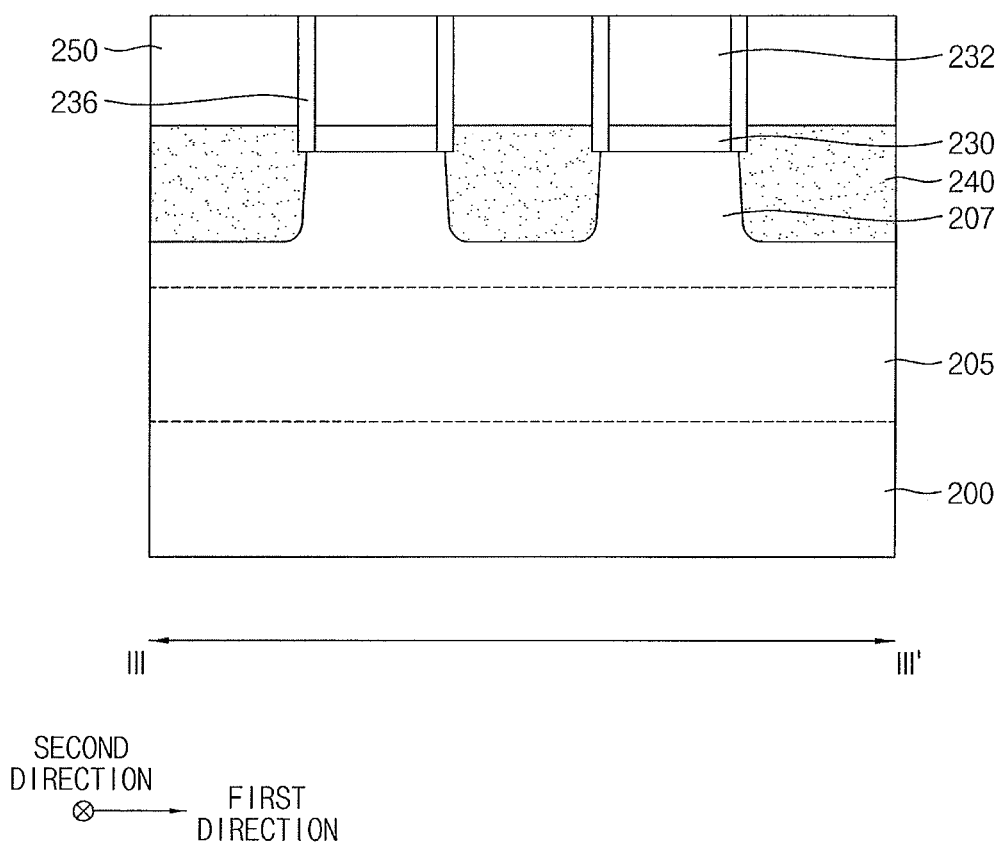

Referring to FIGS. 25 and 26, an additional CMP process may be further performed to remove an upper portion of the insulating interlayer 250 and the dummy gate mask 234. An upper portion of the gate spacer 236 may be also removed by the additional CMP process. A top surface of the dummy gate electrode 232 may be exposed after the removal of the dummy gate mask 234

A polishing composition for removing the dummy gate mask 234 may be different from the polishing composition used in the CMP process illustrated with reference to FIG. 24. For example, the polishing composition having a relatively small polishing selectivity for an oxide layer with respect to a nitride layer may be used for the removal of the dummy gate mask 234.

Figure 27:
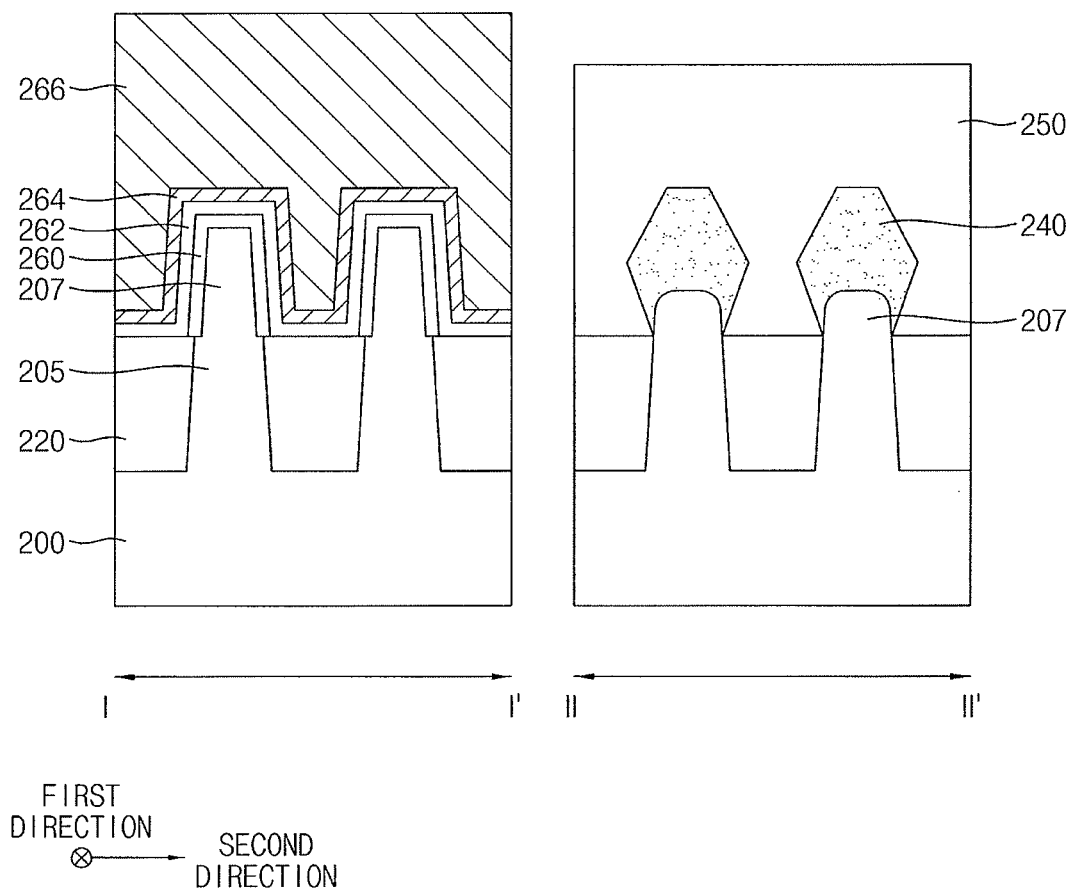
Figure 28:
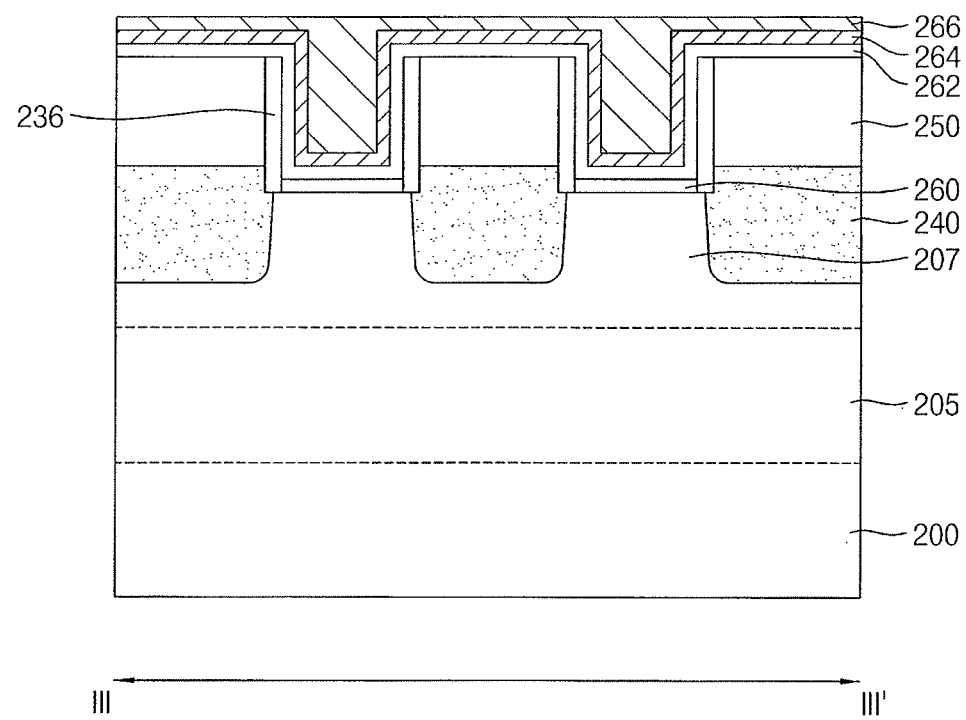

Referring to FIGS. 27 and 28, the dummy gate electrode 232 and the dummy gate insulation pattern 230 may be removed. Accordingly, a trench (not illustrated) exposing an upper portion of the active fin 207 may be formed between a pair of the gate spacers 236.

The exposed active fin 207 may be thermally oxidized to form an interface layer 260. A gate insulation layer 262 may be formed along a top surface of the first insulating interlayer 250, an inner wall of the trench, and top surfaces of the interface layer 260 and the isolation layer 220, and a buffer layer 264 may be formed on the gate insulation layer 262. A gate electrode layer 266 filling a remaining portion of the trench may be formed on the buffer layer 264.

The gate insulation layer 262 may be formed of a metal oxide having a high dielectric constant (high-k) such as hafnium oxide, tantalum oxide, and/or zirconium oxide. The buffer layer 264 may be included for adjusting a work function of a gate electrode. The buffer layer 264 may be formed of a metal nitride such as titanium nitride, tantalum nitride and/or aluminum nitride. The gate electrode layer 266 may be formed of a metal having a low electric constant such as aluminum, copper, tungsten, or the like.

The gate insulation layer 262, the buffer layer 264 and the gate electrode layer 266 may be formed by a CVD process, an ALD process, a PVD process, etc. In some embodiments, the interface layer 260 may be also formed by a deposition process such as a CVD process or an ALD process. In this case, the interface layer 260 may have a profile substantially the same as or similar to that of the gate insulation layer 262.

Figure 29:
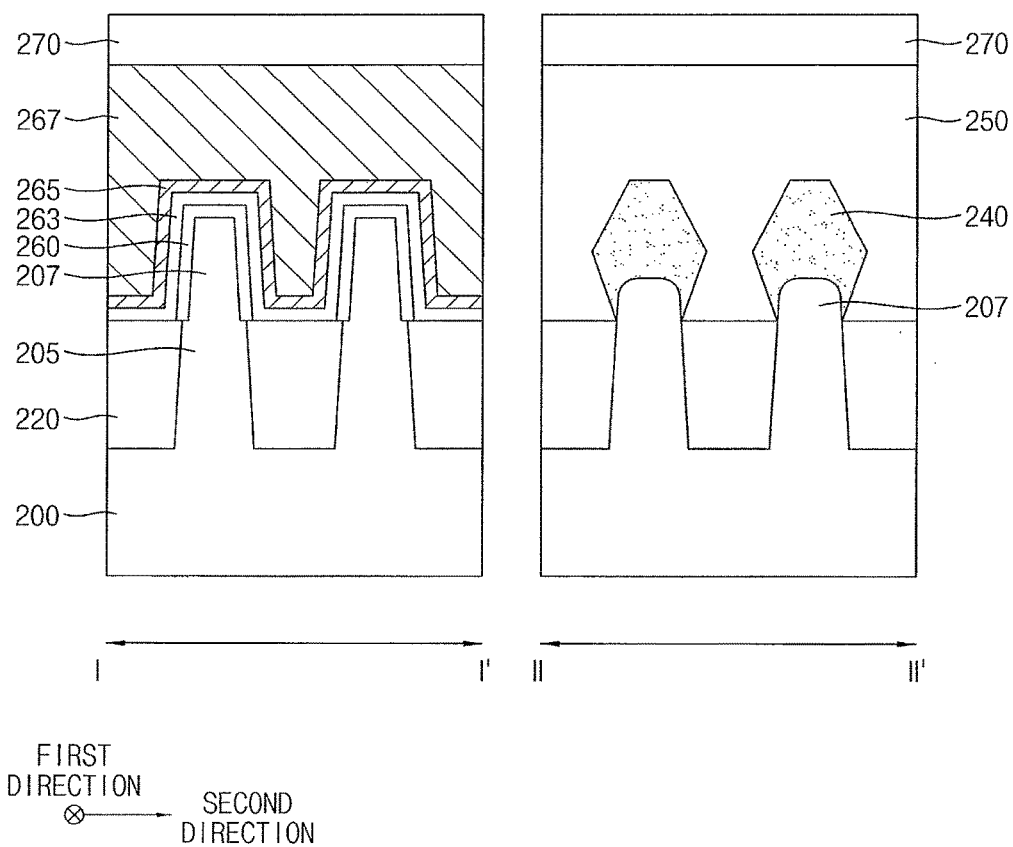
Figure 30:
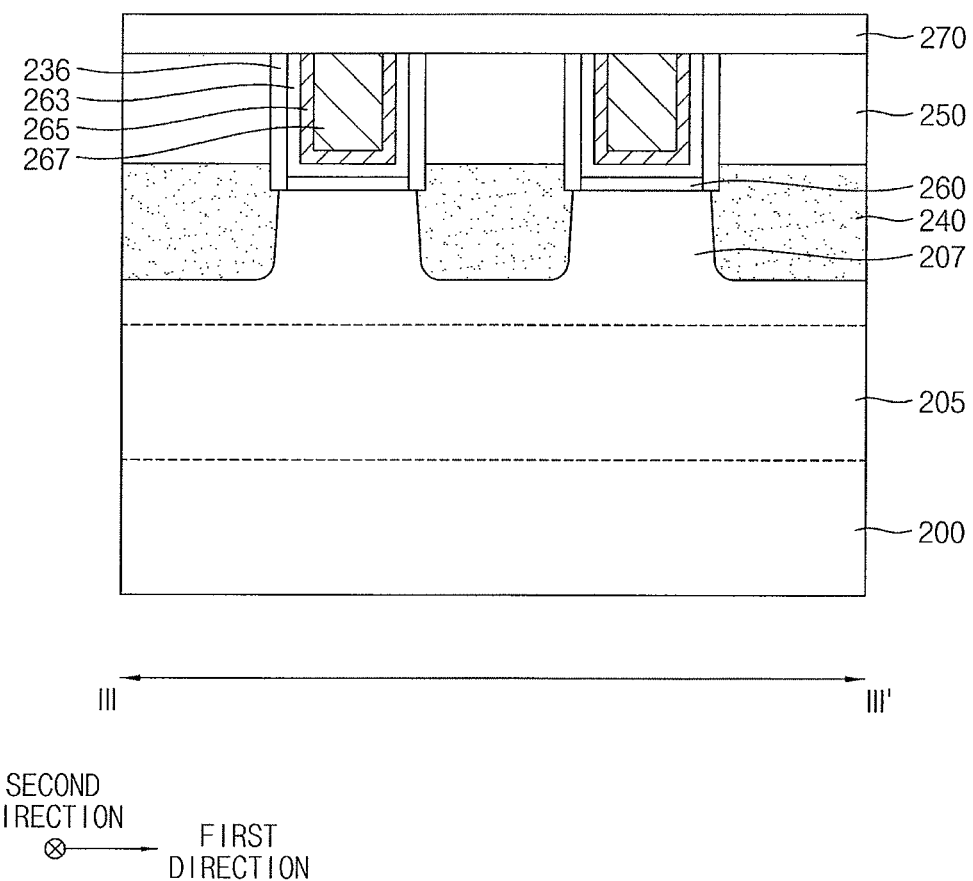

Referring to FIGS. 29 and 30, upper portions of the gate electrode layer 266, the buffer layer 264 and the gate insulation layer 262 may be planarized by, e.g., a CMP process until the top surface of the insulating interlayer 250 may be exposed.

After the planarization process, a gate structure including the interface layer 260, a gate insulation pattern 263, a buffer pattern 265, and a gate electrode 267 may be defined in the trench. An NMOS transistor or a PMOS transistor having a FinFET structure may be defined by the gate structure and the source/drain layer 240.

A passivation layer 270 may be formed on the insulating interlayer 250, the gate spacers 236 and the gate structure. The passivation layer 270 may be formed of a nitride-based material such as silicon nitride or silicon oxynitride by a CVD process. A portion of the passivation layer 270 covering the gate structure may serve as a gate mask.

Figure 31:
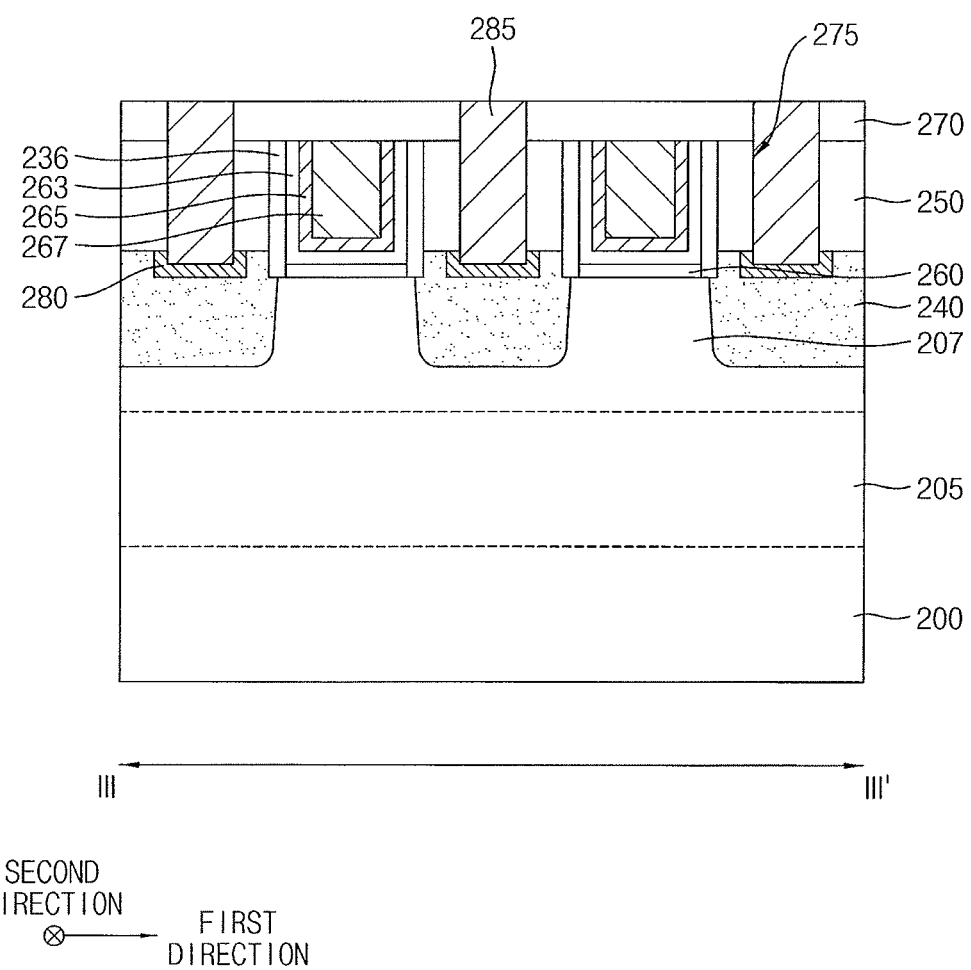

Referring to FIG. 31, a plug 285 electrically connected to the source/drain layer 240 may be formed.

In example embodiments, the passivation layer 270 and the insulating interlayer 250 may be partially etched to form a contact hole 275 through which the source/drain layer 240 may be exposed.

In some embodiments, while performing the etching process for the formation of the contact hole 275, an upper portion of the source/drain layer 240 may be partially removed. Accordingly, the contact hole 275 may be partially inserted into the upper portion of the source/drain layer 240.

In example embodiments, a silicide layer 280 may be formed at the upper portion of the source/drain layer 240 exposed through the contact hole 275. For example, a metal layer may be formed on the source/drain layer 240 exposed through the contact hole 275, and then a thermal treatment such as an annealing process may be performed thereon. A portion of the metal layer contacting the source/drain layer 240 may be transformed into a metal silicide by the thermal treatment. An unreacted portion of the metal layer may be removed to form the silicide layer 280.

The metal layer may be formed of, e.g., cobalt or nickel. The silicide layer 280 may include, e.g., cobalt silicide or nickel silicide.

In some embodiments, a plurality of the source/drain layers 240 may be exposed by one contact hole 275. For example, at least two source/drain layers 240 neighboring each other may be exposed by the contact hole 275 extending in the second direction.

In some embodiments, the contact hole 275 may be self-aligned with the gate spacer 236. In this case, a sidewall of the gate spacer 236 may be exposed by the contact hole 275.

The plug 285 filling the contact hole 275 may be formed. For example, a conductive layer sufficiently filling the contact holes 275 may be formed on the passivation layer 270. An upper portion of the conductive layer may be planarized by a CMP process until a top surface of the passivation layer 270 may be exposed to form the plugs 285. The conductive layer may be formed of a metal, a metal nitride, or a doped polysilicon. In some embodiments, a barrier layer including a metal nitride such as titanium nitride may be further formed along an inner wall of the contact hole 275 before forming the conductive layer.

The plug 285 may contact the silicide layer 280. Thus, an electrical resistance between the plug 285 and the source/drain layer 240 may be reduced. In some embodiments, the plug 285 may extend in the second direction, and may be electrically connected to a plurality of the source/drain layers 240.

Hereinafter, properties of the polishing composition in accordance with example embodiments will be described in more detail with reference to Experimental Examples.

EXPERIMENTAL EXAMPLE

Preparing Polishing Compositions of Examples and Comparative Examples

A first composition was prepared by mixing 3 wt % of a ceria abrasive particle and 0.5 wt % of an ammonium salt of polyacrylic acid as a dispersing agent based on a total weight of a polishing composition.

Based on the total weight of the polishing composition, 0.05 wt % of 1-2-hydroxyethyl-2-pyrrolidone, 0.2 wt % of polyacrylic acid having a weight average molecular weight of about 2,000 as a first dishing inhibitor, and 0.001 wt % of polyethyleneglycol (PEG) having a weight average molecular weight of about 4,000 as a second dishing inhibitor were mixed, and an ammonia water was added to obtain a second composition having a pH between 3 and 4.

The first and second compositions were mixed to obtain the polishing composition of Example having a pH between 6 and 7.

The polishing composition of the Comparative Example was prepared by the method the same as that of Example except for addition of 1-2-hydroxyethyl-2-pyrrolidone.

Experimental Example 1

Evaluations on Etching Amounts of Oxide and Nitride Layers

Figure 32:
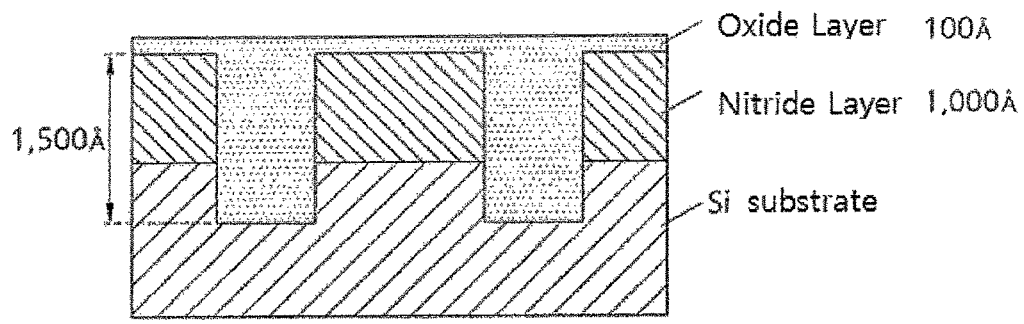
FIG. 32 illustrates a cross-sectional view showing dimensions of a wafer and layers used in Experimental Example.

As illustrated in FIG. 32, a nitride layer having a thickness of 1,000 Å was formed on a silicon (Si) wafer, and a trench having a width of 50 μm was formed. The trench extended to an upper portion of the Si wafer to have a height of 1,500 Å. An oxide layer filling the trench and covering the nitride layer was formed. A height of the oxide layer from a top surface of the nitride layer was 100 Å.

The oxide and nitride layers formed on the Si wafer were polished using the polishing compositions of the Example and Comparative Example by a CMP process under polishing conditions as listed below. After the CMP process, a polishing amount of the nitride layer, a remaining amount of the oxide layer, and a dishing amount were measured, and the results are shown in Table 1 and FIG. 33.

[Polishing Conditions]
1) Polishing apparatus: Elastic ST (300 mm, manufactured by KCTECH)
ii) Pad: IC-1000 (manufactured by Rohm & Haas)
iii) Polishing time: 60 seconds
iv) Rotating speed of a head and a spindle: 60 rpm and 24 rpm
v) Head pressure: 4 psi
vi) R-ring pressure: 7 psi
vii) Flow rate: 200 ml/min

TABLE 1

|  | Polishing Amount of Nitride Layer (Å) | Remaining Amount of Oxide Layer (Å) | Dishing Amount (Å) |
| --- | --- | --- | --- |
| Comparative Example | 70 | 1014 | 416 |
| Example | 27 | 1353 | 90 |

(Remaining amount of oxide layer: height of remaining oxide (Å)/dishing (Å))

Figure 33:
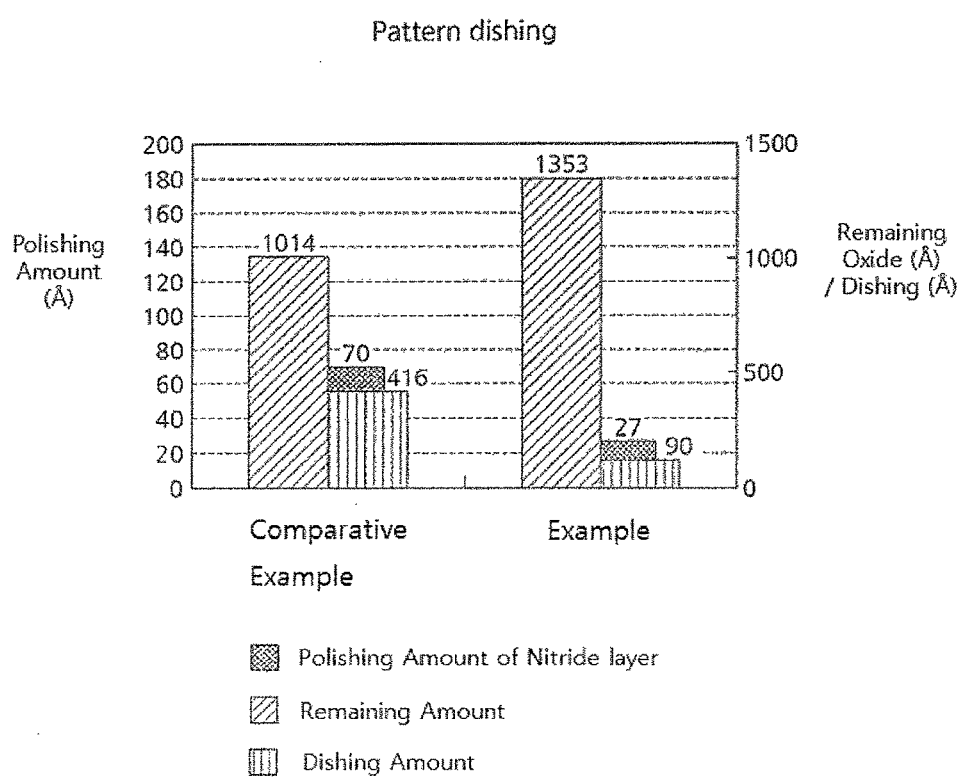
FIG. 33 illustrates a graph showing polishing amounts and dishing amounts by polishing compositions of the Comparative Example and Example.

Referring to Table 1 and FIG. 33, a dishing of the oxide layer was reduced when the polishing composition of Example including the dishing inhibitors was used. Further, the polishing amount of the nitride layer in Example was less than that in Comparative Example. Thus, a polishing selectivity for the oxide layer with respect to the nitride layer was improved in the Example.

Additionally, CMP processes were individually performed on a nitride layer and an oxide layer using the polishing composition of the Comparative Example, and thicknesses of the nitride layer and the oxide layer were measured before the polishing process (Pre), after 20 seconds of the polishing process (20s), and after 40 seconds of the polishing process (40s).

Figure 34:
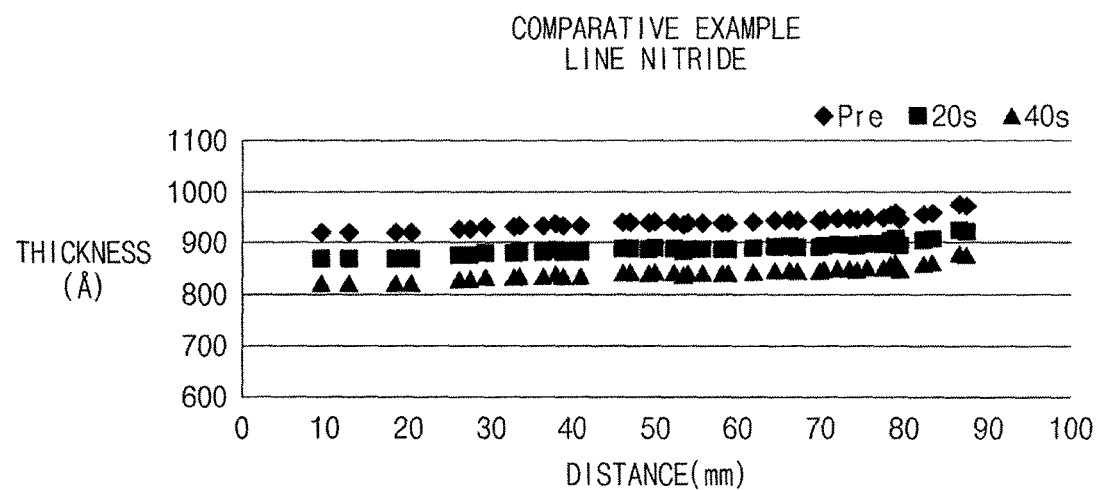
FIGS. 34 and 35 illustrate graphs showing thicknesses of a nitride layer and an oxide layer, respectively, after polishing processes using the polishing composition of the Comparative Example.
Figure 35:
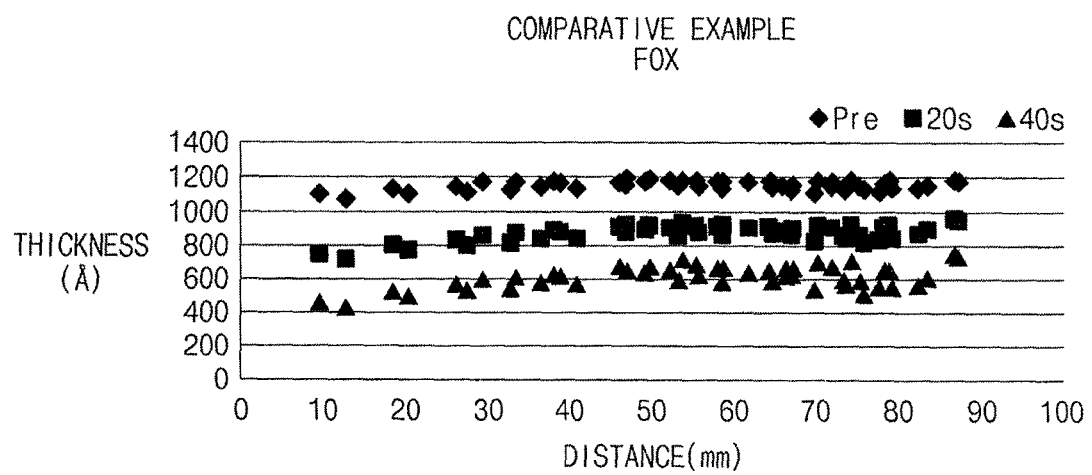

FIGS. 34 and 35 are graphs showing thicknesses of the nitride layer (Line Nitride) and the oxide layer (FOX), respectively, after the polishing processes using the polishing composition of the Comparative Example.

Referring to FIGS. 34 and 35, the thicknesses of the nitride layer and the oxide layer were commonly reduced after 20 seconds and 40 seconds. Thus, sufficient polish-stop properties were not provided by the nitride layer.

CMP processes were individually performed on a nitride layer and an oxide layer using the polishing composition of the Example, and thicknesses of the nitride layer and the oxide layer were measured before the polishing process (Pre), after 20 seconds of the polishing process (20s), and after 40 seconds of the polishing process (40s).

Figure 36:
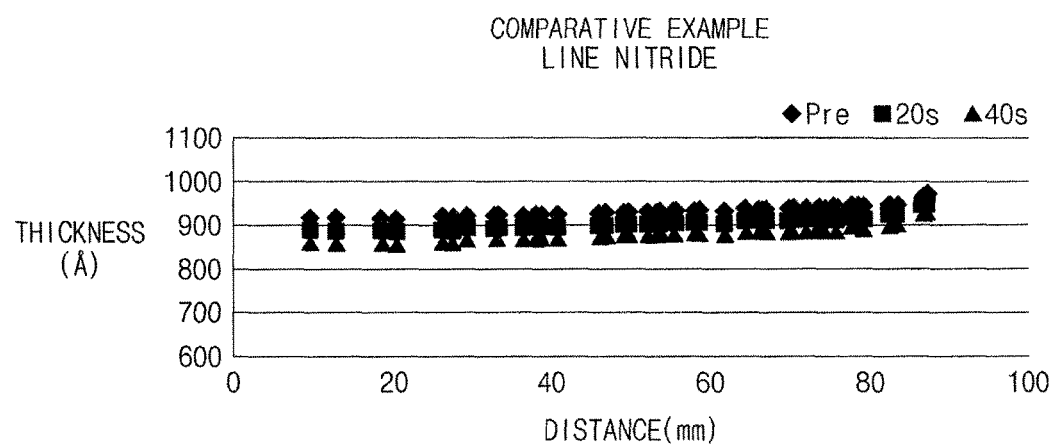
FIGS. 36 and 37 illustrate graphs showing thicknesses of a nitride layer and an oxide layer, respectively, after polishing processes using the polishing composition of Example.
Figure 37:
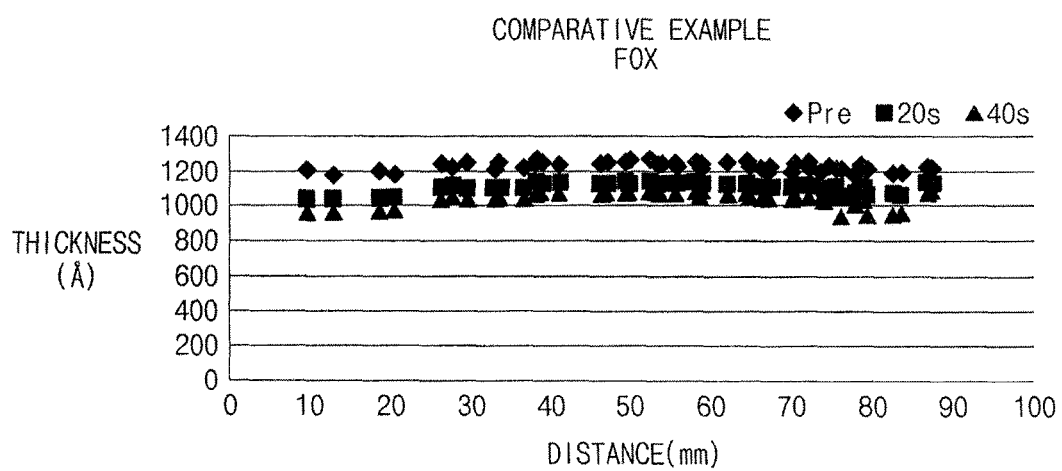

FIGS. 36 and 37 are graphs showing thicknesses of the nitride layer (Line Nitride) and the oxide layer (FOX), respectively, after the polishing processes using the polishing composition of the Example.

Referring to FIGS. 36 and 37, the thickness of the nitride layer was substantially unchanged throughout Pre, 20s, and 40s. Thus, sufficient polish-stop properties were provided by the nitride layer. The thickness of the oxide layer at 40s was substantially similar to that at 20s, and the dishing was substantially suppressed from the oxide layer.

Experimental Example 2

Evaluations on Polishing Properties Varying BET Specific Surface Areas

An oxide layer was polished by a CMP process using the polishing composition of the Example under the same conditions as that in Experimental Example 1, while changing a BET specific surface area before milling and a BET specific surface area after milling of the ceria abrasive particle. After the CMP process, a polishing rate of the oxide layer, the number of defects on a remaining layer and a dishing amount were measured, and the results are shown in Table 2 below.

TABLE 2

|  | BET Surface Area Before Milling ($m^2/g$) | BET Surface Area After Milling ($m^2/g$) | Average Diameter of Secondary Particle (nm) | Polishing Rate (Å/min) | Number of Defects | Dishing Amount (Å) |
| --- | --- | --- | --- | --- | --- | --- |
| Comp. Example 1 | 20 | 23 | 100 | 1800 | 42 | 160 |
| Comp. Example 2 | 9 | 18 | 100 | 1750 | 67 | 200 |
| Example 1 | 4 | 25 | 100 | 1820 | 21 | 120 |

Referring to Table 2, in Comparative Examples 1 and 2 in which the BET specific surface area exceeded about 8 $m^2/g$, the number of the defects and the dishing amount after the CMP process were relatively great.

However, in Example 1 in which the BET specific surface area before milling was less than about 8 $m^2/g$ (4 $m^2/g$), the BET surface area after milling was greater than those of the Comparative Examples, and the number of the defects and the dishing amount were commonly reduced.

Experimental Example 3

Evaluations on Dishings Varying Pattern Densities

As illustrated with reference to FIG. 32, a nitride pattern and a trench were formed and a pattern density was measured. The pattern density was defined as a ratio of a total area of the trench with respect to a unit area of a wafer in a plane view. An oxide layer filling the trench and covering the nitride pattern was formed, and CMP processes were performed using the polishing compositions of Example and Comparative Example. After the CMP processes, dishing amounts were measured, and the results are shown in Table 3 below.

TABLE 3

|  | Dishing Amount (Comparative Example) | Dishing Amount (Example) |
|---|---|---|
| Pattern Density (5%) | 24.6 nm | 18.7 nm |
| Pattern Density (10%) | 17.1 nm | 16.9 nm |

Referring to Table 3, when the pattern density (e.g., a density of the trench) was about 5%, the dishing amount was reduced by at least about 20% from the polishing composition of Example. When the pattern density was about 10%, the dishing amount was slightly reduced.

Accordingly, the polishing composition in accordance with example embodiments may be utilized for a CMP process with respect to a trench having a nano-scaled critical dimension and an oxide layer therein.

By way of summation and review, a polishing composition including a polishing agent may be provided between a substrate and a polishing pad so that the layers on the substrate may be planarized. Suitable polishing rate and polishing uniformity may be required while preventing damage of the layers during the CMP process.

As described above, example embodiments relate to polishing compositions including a polishing agent and additives, and methods of manufacturing semiconductor devices using the same.

Example embodiments may provide a polishing composition having improved planarization property.

Example embodiments may provide a method of manufacturing a semiconductor device using the polishing composition.

According to example embodiments, the polishing composition may include pyrrolidone containing a hydrophilic group, and may include, e.g., polyacrylic acid and a non-ionic polymer as a first dishing inhibitor and a second dishing inhibitor. Thus, a dishing of an oxide layer may be substantially suppressed while achieving a sufficient polishing selectivity relatively to a nitride layer. Further, a surface area of an abrasive particle may be controlled so that a dishing inhibition may be improved and surface defects of a polishing target layer may be avoided. Therefore, an isolation layer or an insulating interlayer having uniform surface profiles and heights may be achieved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A polishing composition, comprising:
   abrasive ceria particles;
   one or more of 1-2-hydroxyethyl-2-pyrrolidone, 4-hydroxy-2-pyrrolidone, hydroxymethyl pyrrolidone, hydroxyethyl pyrrolidone, or N-hydroxymethyl-2-pyrrolidone;
   a dispersing agent;
   a first dishing inhibitor including a polyacrylic acid; and
   a second dishing inhibitor including a non-ionic polymer,
   wherein a BET specific surface area before milling of the abrasive ceria particles is in a range from about 3 $m^2/g$ to about 8 $m^2/g$, and a BET specific surface area after milling of the abrasive ceria particle is about 10 $m^2/g$ to less than 30 $m^2/g$, and
   wherein the composition has an etch selectivity for a silicon oxide layer relative to a silicon nitride layer such that the composition preferentially removes the silicon oxide layer.

2. The polishing composition as claimed in claim 1, wherein the BET specific surface area after milling of the abrasive ceria particles is about 20 $m^2/g$ to 25 $m^2$.

3. The polishing composition as claimed in claim 1, wherein 1-2-hydroxyethyl-2-pyrrolidone is included in the composition.

4. The polishing composition as claimed in claim 1, wherein the dispersing agent includes one or more of an anionic polymer neutralized by a compound including a hydroxyl group or an anionic polymer.

5. The polishing composition as claimed in claim 4, wherein the dispersing agent includes one or more of a polyacrylic acid, a salt of the polyacrylic acid, a polymethacrylic acid, a salt of the polymethacrylic acid, a polyacrylic-maleic acid copolymer, or a salt of the polyacrylic-maleic acid copolymer.

6. The polishing composition as claimed in claim 4, wherein the anionic polymer has a weight average molecular weight in a range from about 10,000 to about 100,000.

7. The polishing composition as claimed in claim 1, wherein the first dishing inhibitor includes a polyacrylic acid having a weight average molecular weight in a range from about 500 to about 10,000.

8. The polishing composition as claimed in claim 1, wherein the second dishing inhibitor includes one or more of a polyethyleneglycol, a polyvinylalcohol, glycerine, a polypropyleneglycol, or a polyvinylpyrrolidone.

9. The polishing composition as claimed in claim 8, wherein the second dishing inhibitor includes one or more of a polyethyleneglycol, a polyvinylalcohol, glycerine, a polypropyleneglycol, or a polyvinylpyrrolidone that has a weight average molecular weight in a range from about 500 to about 10,000.

10. The polishing composition as claimed in claim 1, wherein the composition includes:
    about 0.1 weight percent to about 10 weight percent of the abrasive ceria particles;
    about 0.01 weight percent to about 5 weight percent of the one or more of 1-2-hydroxyethyl-2-pyrrolidone, 4-hydroxy-2-pyrrolidone, hydroxymethyl pyrrolidone, hydroxyethyl pyrrolidone, or N-hydroxymethyl-2-pyrrolidone;
    about 0.01 weight percent to about 10 weight percent of the dispersing agent;
    about 0.05 weight percent to about 5 weight percent of the first dishing inhibitor;

about 0.0005 weight percent to about 0.1 weight percent of the second dishing inhibitor; and
a remainder of a diluent, based on a total weight of the polishing composition.

11. A composition, comprising:
a diluent;
abrasive ceria particles;
one or more of 1-2-hydroxyethyl-2-pyrrolidone, 4-hydroxy-2-pyrrolidone, hydroxymethyl pyrrolidone, hydroxyethyl pyrrolidone, or N-hydroxymethyl-2-pyrrolidone;
a first polyacrylic acid having a weight average molecular weight in a range from about 500 to about 10,000;
one or more of:
   a second polyacrylic acid having a weight average molecular weight in a range from about 10,000 to about 100,000, an ammonium salt of the second polyacrylic acid, a polymethacrylic acid having a weight average molecular weight in a range from about 10,000 to about 100,000, an ammonium salt of the polymethacrylic acid, a polyacrylic-maleic acid copolymer having a weight average molecular weight in a range from about 10,000 to about 100,000, a salt of the polyacrylic-maleic acid copolymer, a carboxylic acid, a salt of a carboxylic acid, a sulfonic ester, a salt of a sulfonic ester, a sulfonic acid, a salt of a sulfonic acid, a phosphoric ester, or a salt of a phosphoric ester, and one or more of:
   a polyethyleneglycol, a polyvinylalcohol, glycerine, a polypropyleneglycol, or a polyvinylpyrrolidone,
wherein a BET specific surface area before milling of the abrasive ceria particles is in a range from about 3 $m^2/g$ to about 8 $m^2/g$, and a BET specific surface area after milling of the abrasive ceria particle is about 10 $m^2/g$ to less than 30 $m^2/g$, and
wherein the composition has an etch selectivity for a silicon oxide layer relative to a silicon nitride layer such that the composition preferentially removes the silicon oxide layer.

12. The composition as claimed in claim 11, wherein the composition has a pH that is in a range of about 6 to 7.

13. The composition as claimed in claim 11, wherein the pH of the composition is basic or neutral.

14. A polishing composition, comprising:
abrasive ceria particles;
1-2-hydroxyethyl-2-pyrrolidone;
a dispersing agent;
a first dishing inhibitor including polyacrylic acid; and
a second dishing inhibitor including a non-ionic polymer,
wherein a BET specific surface area before milling of the abrasive ceria particles is in a range from about 3 $m^2/g$ to about 8 $m^2/g$, and a BET specific surface area after milling of the abrasive ceria particle is about 10 $m^2/g$ to less than 30 $m^2/g$, and
wherein the composition has an etch selectivity for a silicon oxide layer relative to a silicon nitride layer such that the composition preferentially removes the silicon oxide layer.

* * * * *